US012677582B2

(12) United States Patent
Hironaka et al.

(10) Patent No.: US 12,677,582 B2
(45) Date of Patent: Jul. 7, 2026

(54) METHOD FOR MANUFACTURING ORGANIC SEMICONDUCTOR ELEMENT

(71) Applicant: HAMAMATSU PHOTONICS K.K., Hamamatsu (JP)

(72) Inventors: Kosuke Hironaka, Hamamatsu (JP); Shigeo Hara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 435 days.

(21) Appl. No.: 18/387,127

(22) Filed: Nov. 6, 2023

(65) Prior Publication Data

US 2024/0188408 A1      Jun. 6, 2024

(30) Foreign Application Priority Data

Dec. 2, 2022    (JP) ................................. 2022-193367

(51) Int. Cl.
*H10K 71/80*          (2023.01)
*H10K 71/60*          (2023.01)

(52) U.S. Cl.
CPC ............. *H10K 71/80* (2023.02); *H10K 71/60* (2023.02)

(58) Field of Classification Search
CPC ........ H10K 71/80; H10K 71/60; H10K 10/40; H10K 10/10; H10K 10/701; H10K 50/15; H10K 50/16; H10K 50/17; H10K 50/14; H10K 50/156; H10K 50/166; H10K 50/171; H10K 50/00; H10K 85/00; H10K 85/40; H10K 85/30; H10K 85/10; H10K 85/154; H10K 85/151; H10K 85/141;

H10K 85/111; H10K 85/113; H10K 85/114; H10K 85/115; H10K 2101/00; H10K 2101/50; H10K 2101/10; H10K 2101/20;

(Continued)

(56) References Cited

U.S. PATENT DOCUMENTS 9,236,533 B2 * 1/2016 Im ......................... H10H 20/018
11,888,012 B2 * 1/2024 Murata ............... H10F 39/8057

(Continued)

FOREIGN PATENT DOCUMENTS

CN            1628492 A * 6/2005 ............. H05B 33/10
JP      2013229258 A * 11/2013

(Continued)

*Primary Examiner* — Lawrence C Tynes, Jr.
(74) *Attorney, Agent, or Firm* — Faegre Drinker Biddle & Reath LLP

(57)          ABSTRACT

A method for manufacturing an organic semiconductor element includes a process of forming a first terminal on a main surface of a substrate, a process of forming a first electrode on the main surface, a process of forming an organic semiconductor layer on the first electrode, a process of forming a second electrode on the organic semiconductor layer, a process of forming a sacrificial layer in a predetermined region on the main surface, a process of forming a barrier layer on the main surface by an ALD method to cover the first terminal, the first electrode, the second electrode, the organic semiconductor layer, and the sacrificial layer, and a process of removing the sacrificial layer and a portion of the barrier layer that covers the sacrificial layer. The organic semiconductor layer and the sacrificial layer are apart from each other after the process of forming the barrier layer.

15 Claims, 23 Drawing Sheets

(58) Field of Classification Search
    CPC ........... H10K 2101/25; H10K 2101/27; H10K
            2101/30; H10K 2101/40; H10K 2101/60;
            H10K 2101/70; H10K 2101/80; H10K
                2101/90; H10K 2102/20
    See application file for complete search history.

(56)                References Cited

U.S. PATENT DOCUMENTS 12,538,640  B2 *    1/2026  Niikura  .................. H10K 50/16
 2021/0183907  A1 *    6/2021  Jongman  ................ H10K 71/60
 2021/0313381  A1 *   10/2021  Murata  ................. H10F 39/813

FOREIGN PATENT DOCUMENTS

JP          2014179374  A  *   9/2014
 JP          2019-079740 A       5/2019

* cited by examiner

*Fig.6A*

METHOD FOR MANUFACTURING ORGANIC SEMICONDUCTOR ELEMENT

TECHNICAL FIELD

The present disclosure relates to a method for manufacturing an organic semiconductor element.

BACKGROUND

A method for manufacturing an organic semiconductor element including a process of forming an electrode and a terminal on a substrate, a process of integrally forming an organic semiconductor layer and a sacrificial layer such that the organic semiconductor layer is positioned on the electrode and the sacrificial layer is positioned on the terminal, a process of forming a barrier layer by an atomic layer deposition (ALD) method to cover the organic semiconductor layer and the sacrificial layer, and a process of removing the sacrificial layer and a portion of the barrier layer corresponding to the terminal by irradiation with a laser beam has been known (see, for example, Japanese Unexamined Patent Publication No. 2019-79740).

SUMMARY

According to the method for manufacturing an organic semiconductor element, it is possible to expose the terminal formed on the substrate. However, since the organic semiconductor layer and the sacrificial layer are integrally formed, there is a concern that a portion of the organic semiconductor layer along the sacrificial layer is damaged or exposed at the time of irradiation with the laser beam.

An object of the present disclosure is to provide a method for manufacturing an organic semiconductor element capable of exposing a predetermined region on a substrate while an organic semiconductor layer is covered with a barrier layer.

A method for manufacturing an organic semiconductor element according to one aspect of the present disclosure is [1] "a method for manufacturing an organic semiconductor element including a first process of preparing a substrate having a main surface, a second process of forming a first terminal on the main surface at least after the first process, a third process of forming a first electrode to be electrically connected to the first terminal on the main surface at least after the first process, a fourth process of forming an organic semiconductor layer on the first electrode at least after the third process, a fifth process of forming a second electrode on the organic semiconductor layer at least after the fourth process, a sixth process of forming a sacrificial layer made of an organic material identical to the organic semiconductor layer in a predetermined region on the main surface at least after the first process, a seventh process of forming a barrier layer on the main surface by an ALD method to cover the first terminal, the first electrode, the second electrode, the organic semiconductor layer, and the sacrificial layer after the second process, the fifth process, and the sixth process, and an eighth process of removing the sacrificial layer and a portion of the barrier layer that covers the sacrificial layer after the seventh process. The organic semiconductor layer and the sacrificial layer are apart from each other after the second process, the fifth process, and the sixth process and before the seventh process.".

BRIEF DESCRIPTION OF THE DRAWINGS

FIG. 6A is a plan view of the intermediate in the method for manufacturing an organic semiconductor element illustrated in FIG. 4

DETAILED DESCRIPTION

Figure 1:
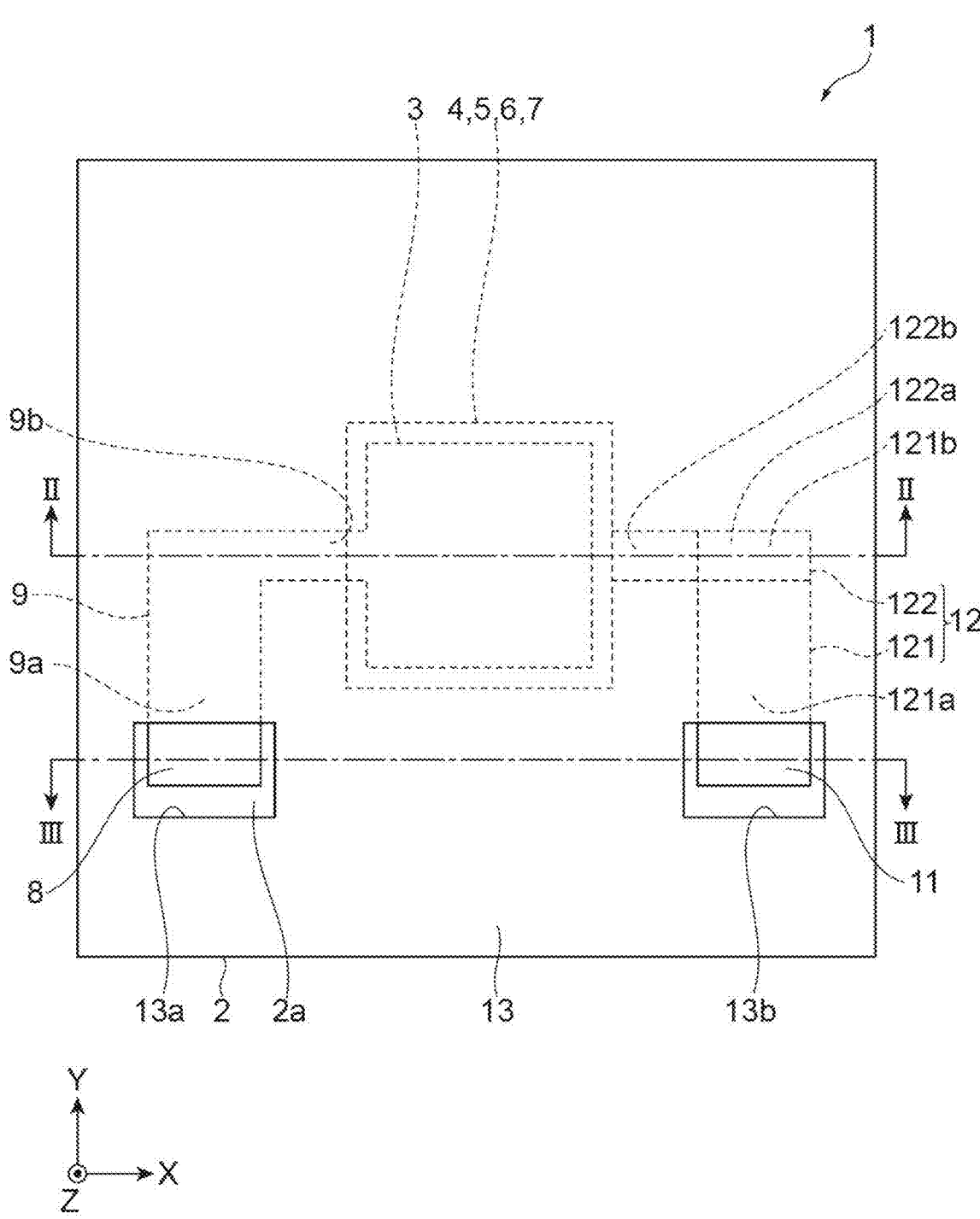
FIG. 1 is a plan view of an organic semiconductor element manufactured by a method for manufacturing an organic semiconductor element according to an embodiment.

Hereinafter, embodiments of the present disclosure will be described in detail with reference to the drawings. In the drawings, identical or corresponding parts are denoted by identical reference signs, and redundant description will be omitted.

Figure 2:
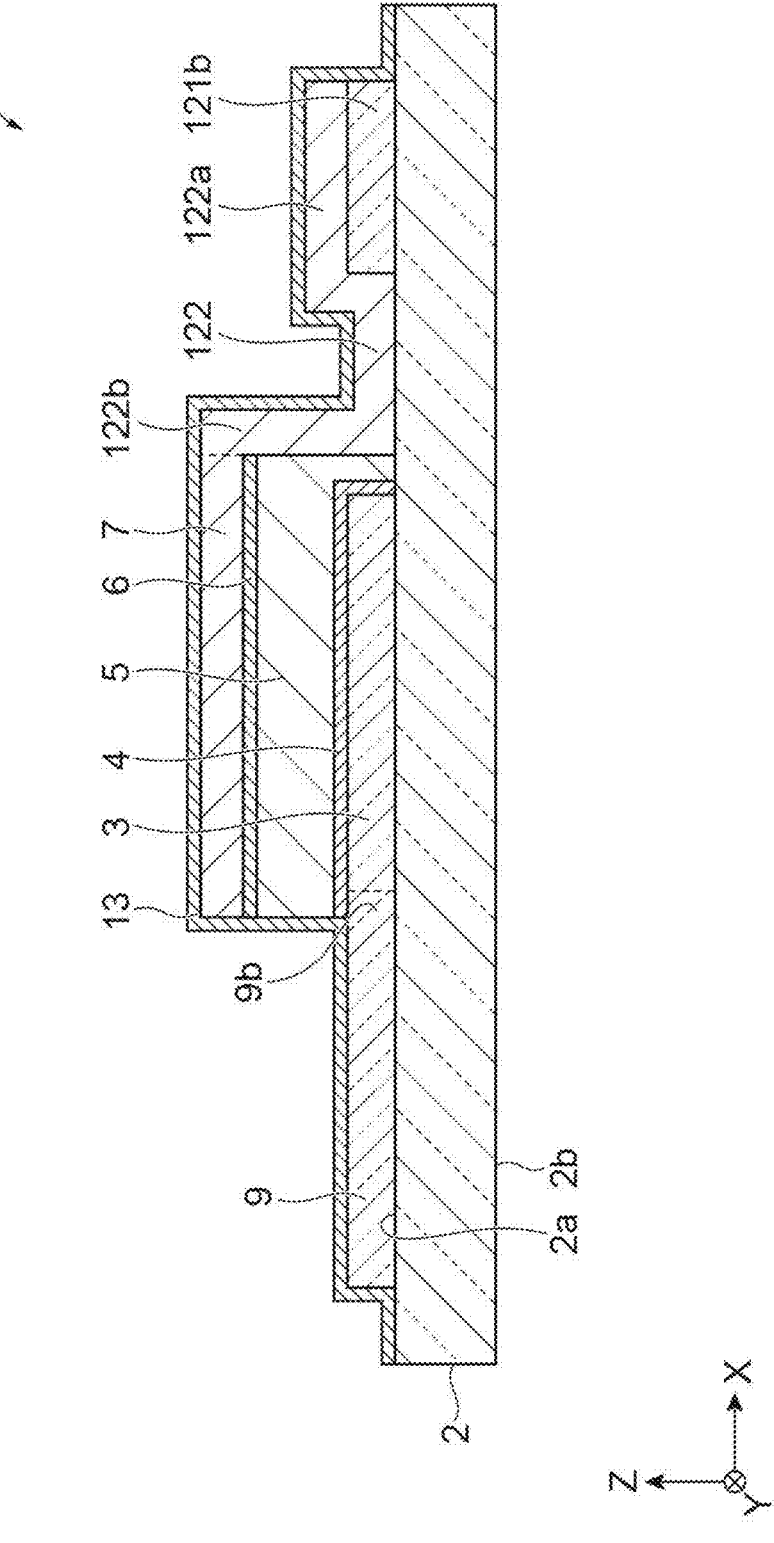
FIG. 2 is a cross-sectional view of the organic semiconductor element taken along line II-II illustrated in FIG. 1.
Figure 3:
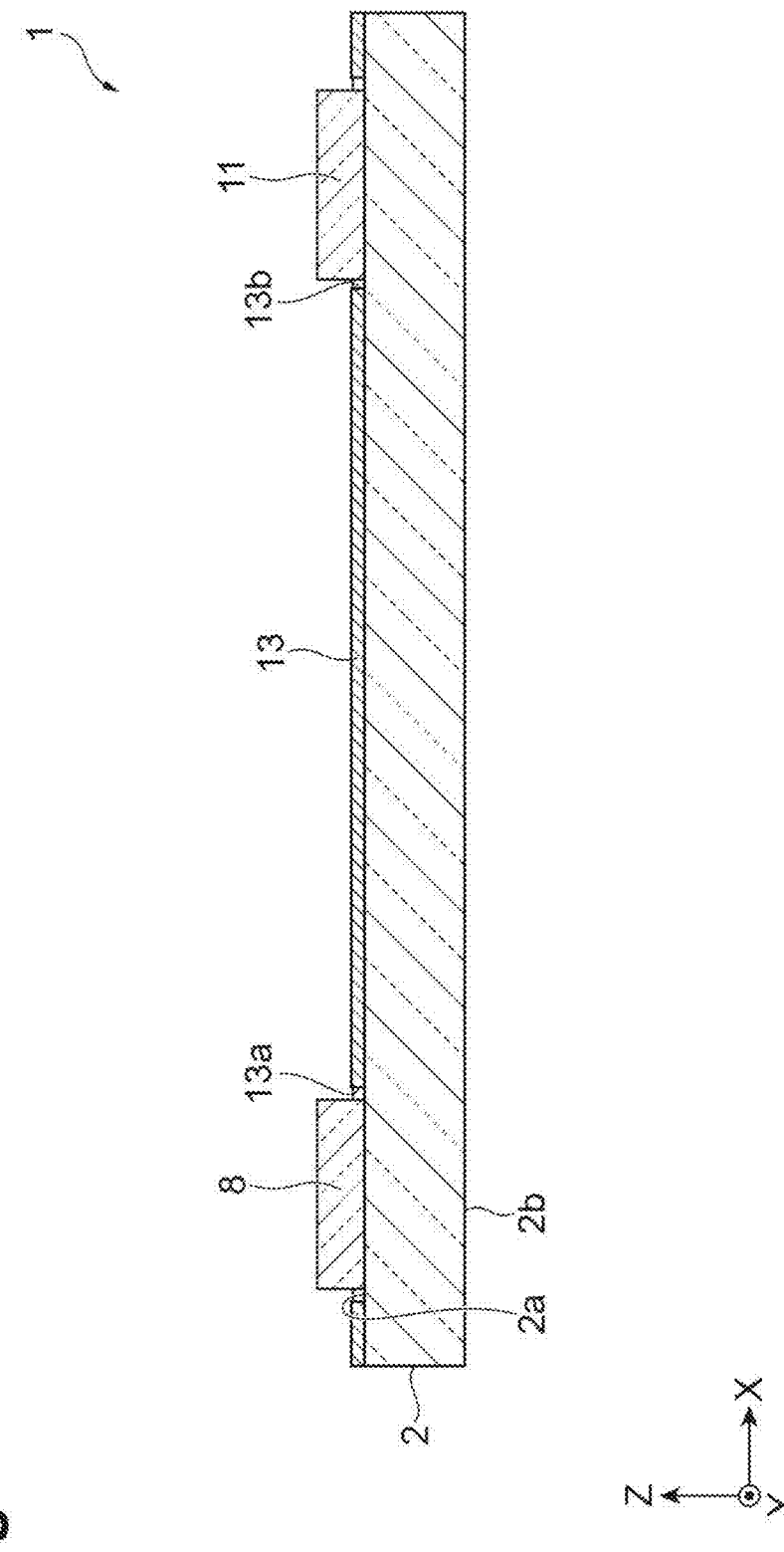
FIG. 3 is a cross-sectional view of the organic semiconductor element taken along line III-III illustrated in FIG. 1.

As illustrated in FIGS. 1, 2, and 3, an organic semiconductor element 1 includes a substrate 2, a first electrode 3, a first functional layer 4, an organic semiconductor layer 5, a second functional layer 6, a second electrode 7, a first terminal 8, a first wiring 9, a second terminal 11, a second wiring 12, and a barrier layer 13. Hereinafter, a thickness direction of the substrate 2 is referred to as a Z-axis direction, one direction perpendicular to the Z-axis direction is referred to as an X-axis direction, and a direction perpendicular to both the Z-axis direction and the X-axis direction is referred to as a Y-axis direction.

The substrate 2 has a main surface 2a and a main surface 2b opposite to the main surface 2a. The substrate 2 is formed in, for example, a rectangular plate shape. The substrate 2 is, for example, a glass substrate or a resin film. A thickness of the substrate 2 is, for example, 10 μm or more and several mm or less.

The first electrode 3 is arranged on the main surface 2a of the substrate 2. In the present embodiment, the first electrode 3 is in contact with the main surface 2a of the substrate 2. The first electrode 3 is formed in, for example, a rectangular film shape. The first electrode 3 is positioned, for example, substantially at a center of the main surface 2a as viewed from the Z-axis direction. A thickness of the first electrode 3 is, for example, 10 nm or more and 5000 nm or less. In this case, the thickness of the first electrode 3 may be 10 nm or more and 1000 nm or less, or may be 50 nm or more and 300 nm or less. A material of the first electrode 3 is, for example, ITO, AZO, or FTO.

The first functional layer 4 is arranged on the first electrode 3. In the present embodiment, the first functional layer 4 includes an outer edge portion arranged on the main surface 2*a* of the substrate 2 and a main body portion (a portion inside the outer edge portion) arranged on the first electrode 3. The outer edge portion of the first functional layer 4 is in contact with the main surface 2*a* of the substrate 2, and the main body portion of the first functional layer 4 is in contact with the first electrode 3. The first functional layer 4 includes at least one layer of a work function adjustment layer, a charge injection layer, a charge transport layer, a getter layer, or a spacer layer. That is, the first functional layer 4 may have a single layer structure or a multilayer structure. The first functional layer 4 is formed in, for example, a rectangular layer shape. A thickness of a layer included in the first functional layer 4 is, for example, 1 nm or more and 200 nm or less.

The organic semiconductor layer 5 is arranged on the first functional layer 4. In the present embodiment, the organic semiconductor layer 5 includes an outer edge portion arranged on the main surface 2*a* of the substrate 2 and a main body portion (a portion inside the outer edge portion) arranged on the first functional layer 4. The outer edge portion of the organic semiconductor layer 5 is in contact with the main surface 2*a* of the substrate 2, and surrounds an entire circumference of the first electrode 3, for example, as viewed from the Z-axis direction. The main body portion of the organic semiconductor layer 5 is in contact with the first functional layer 4. The organic semiconductor layer 5 is formed in, for example, a rectangular layer shape. Alternatively, the organic semiconductor layer 5 may be formed in a circular film shape. The circular shape includes a perfect circle, an oval, or an ellipse. A thickness of the organic semiconductor layer 5 is, for example, 50 nm or more and 5000 nm or less. In that case, the thickness of the organic semiconductor layer 5 may be 50 nm or more and 1000 nm or less, or may be 50 nm or more and 500 nm or less. The organic semiconductor layer 5 is made of an organic material. In the present embodiment, the organic semiconductor layer 5 contains a p-type organic semiconductor and a n-type organic semiconductor as the organic materials.

Examples of the p-type organic semiconductor contained in the organic semiconductor layer 5 include a compound (for example, a polymer) having a skeleton derived from at least one compound selected from the group consisting of thiophene, benzothiophene, phenylenevinylene, carbazole, thienopyrrole, diketo-pyrrolo-pyrrole, and derivatives thereof. The p-type organic semiconductor contained in the organic semiconductor layer 5 can be used by combining one or more kinds of the above compounds.

Examples of the n-type organic semiconductor contained in the organic semiconductor layer 5 include at least one compound selected from the group consisting of fullerenes, fullerene derivatives, carbon nanotubes, and carbon nanotube derivatives. Examples of the fullerene derivative include $PC_{61}BM$. The n-type organic semiconductor contained in the organic semiconductor layer 5 can be used by combining one or more kinds of the above compounds.

The second functional layer 6 is arranged on the organic semiconductor layer 5. In the present embodiment, the second functional layer 6 is in contact with the organic semiconductor layer 5. Similarly to the first functional layer 4, the second functional layer 6 includes at least one layer of a work function adjustment layer, a charge injection layer, a charge transport layer, a getter layer, or a spacer layer. That is, the second functional layer 6 may have a single layer structure or a multilayer structure. The second functional layer 6 is formed in, for example, a rectangular layer shape. A thickness of a layer included in the second functional layer 6 is, for example, 1 nm or more and 200 nm or less.

The second electrode 7 is arranged on the second functional layer 6. In the present embodiment, the second electrode 7 is in contact with the second functional layer 6. The second electrode 7 is formed in, for example, the rectangular film shape. A thickness of the second electrode 7 is, for example, 10 nm or more and 5000 nm or less. In this case, the thickness of the second electrode 7 may be 10 nm or more and 1000 nm or less, or may be 50 nm or more and 300 nm or less. A material of the second electrode 7 is, for example, Pt, Au, Ag, Al, or Cu.

The first terminal 8 is arranged on the main surface 2*a* of the substrate 2. In the present embodiment, the first terminal 8 is in contact with the main surface 2*a* of the substrate 2. As an example, the first terminal 8 is positioned on one side in the X-axis direction and one side in the Y-axis direction relative to the first electrode 3. The first terminal 8 is formed in, for example, the rectangular film shape.

The first wiring 9 is arranged on the main surface 2*a* of the substrate 2. In the present embodiment, the first wiring 9 is in contact with the main surface 2*a* of the substrate 2. One end 9*a* of the first wiring 9 is connected to the first terminal 8. The other end 9*b* of the first wiring 9 is connected to the first electrode 3. As a result, the first electrode 3 and the first terminal 8 are electrically connected via the first wiring 9. In the present embodiment, the first terminal 8 and the first wiring 9 are formed integrally with the first electrode 3. In the present embodiment, a material of the first terminal 8 and the first wiring 9 is identical to the material of the first electrode 3. A thickness of the first terminal 8 and a thickness of the first wiring 9 are, for example, substantially equal to the thickness of the first electrode 3.

The second terminal 11 is arranged on the main surface 2*a* of the substrate 2. In the present embodiment, the second terminal 11 is in contact with the main surface 2*a* of the substrate 2. As an example, the second terminal 11 is positioned on the other side in the X-axis direction and on one side in the Y-axis direction relative to the first electrode 3. The second terminal 11 is formed in, for example, the rectangular film shape.

The second wiring 12 is arranged on the main surface 2*a* of the substrate 2. In the present embodiment, the second wiring 12 is in contact with the main surface 2*a* of the substrate 2. The second wiring 12 includes a first portion 121 and a second portion 122. One end 121*a* of the first portion 121 is connected to the second terminal 11. In the present embodiment, the second terminal 11 and the first portion 121 are formed integrally with each other. A material of the second terminal 11 and the first portion 121 is identical to the material of the first electrode 3. A thickness of the second terminal 11 and a thickness of the first portion 121 are, for example, substantially equal to the thickness of the first electrode 3. One end 122*a* of the second portion 122 rides on the other end 121*b* of the first portion 121 from the main surface 2*a* of the substrate 2, and is connected to the other end 121*b* of the first portion 121. The other end 122*b* of the second portion 122 is connected to the second electrode 7 from the main surface 2*a* of the substrate 2 via a side surface (an outer edge portion) of the organic semiconductor layer 5. As a result, the second electrode 7 and the second terminal 11 are electrically connected via the second wiring 12. In the present embodiment, the second portion 122 is formed integrally with the second electrode 7. In the present embodiment, a material of the second portion 122 is identical to the material of the second electrode 7. A thickness of the second portion 122 is, for example, substantially equal to the thickness of the second electrode 7.

The barrier layer 13 is arranged on the main surface 2a of the substrate 2. The barrier layer 13 covers the first electrode 3, the first functional layer 4, the organic semiconductor layer 5, the second functional layer 6, the second electrode 7, the first wiring 9, and the second wiring 12. The barrier layer 13 is also arranged on the main surface 2b of the substrate 2. In the present embodiment, the barrier layer 13 covers the main surfaces 2a and 2b of the substrate 2, the first electrode 3, the first functional layer 4, the organic semiconductor layer 5, the second functional layer 6, the second electrode 7, the first wiring 9, and the second wiring 12 in a state where the first terminal 8 and the second terminal 11 are exposed. The barrier layer 13 has a first opening 13a and a second opening 13b. The first terminal 8 is exposed to an outside through the first opening 13a. The second terminal 11 is exposed to the outside through the second opening 13b. In the present embodiment, a thickness of the barrier layer 13 is ¹⁄₁₀ or less of the sum of the thickness of the first electrode 3, the thickness of the organic semiconductor layer 5, and the thickness of the second electrode 7. The thickness of the barrier layer 13 is, for example, 5 nm or more and 100 nm or less. In that case, the thickness of the barrier layer 13 may be 5 nm or more and 70 nm or less, or may be 5 nm or more and 40 nm or less. The barrier layer 13 is formed by an atomic layer deposition (ALD) method. In the present embodiment, the barrier layer 13 is formed by alternately laminating a plurality of first layers made of a first material and a plurality of second layers made of a second material different from the first material one by one. A material of each of the first layer and the second layer is, for example, $TiO_2$, $Al_2O_3$, $HfO_2$, ZnO, $SnO_2$, $In_2O_3$, TiN, $Si_3N_4$, Pt, or Ag.

Figure 4:
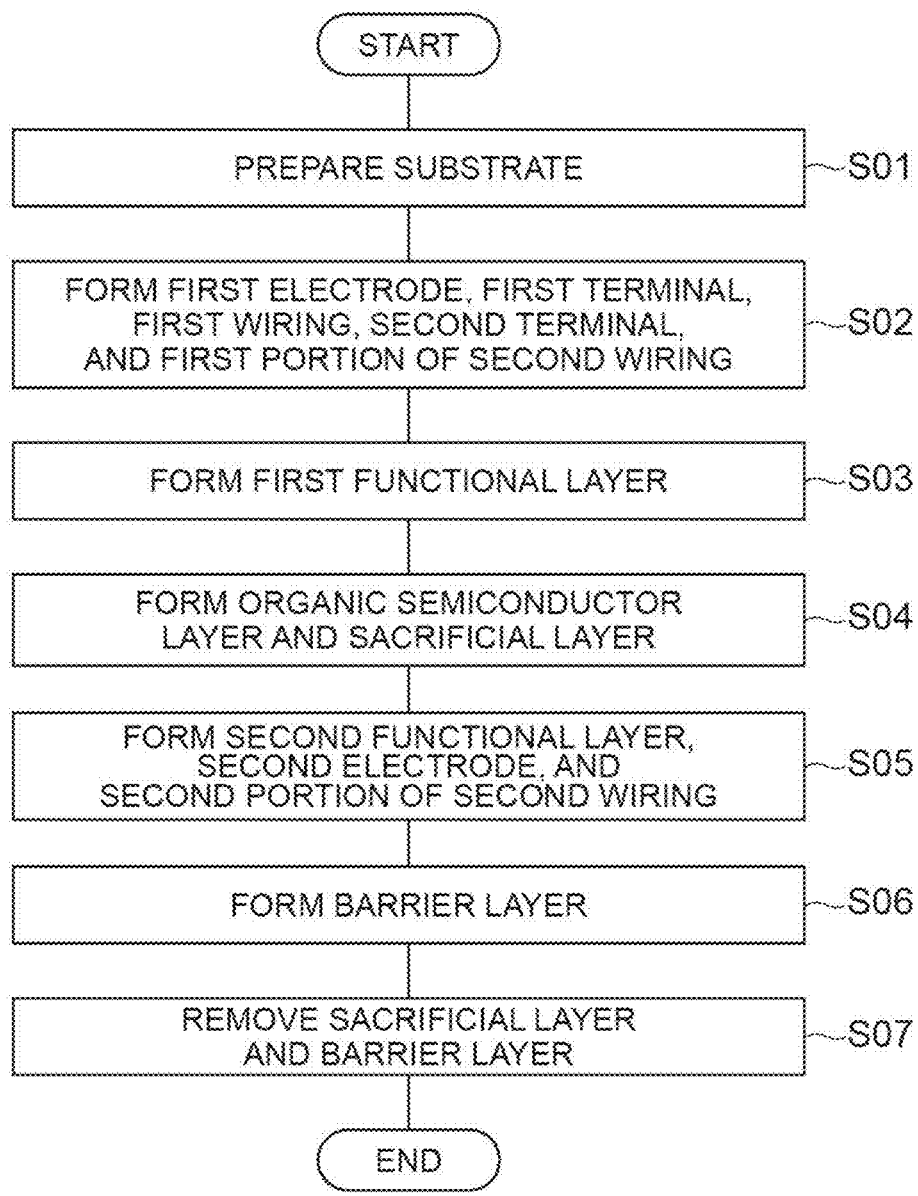
FIG. 4 is a flowchart of the method for manufacturing an organic semiconductor element according to an embodiment.

A method for manufacturing the above-described organic semiconductor element 1 (a method for manufacturing the organic semiconductor element 1) will be described along the flowchart shown in FIG. 4. First, the substrate 2 is prepared (step S01). A cleaning treatment is performed on the substrate 2 prepared in step S01. Examples of the cleaning treatment performed on the substrate 2 include wet cleaning using an organic solvent or pure water, and dry cleaning using plasma or ultraviolet rays. The cleaning treatment performed on the substrate 2 is not limited to the cleaning treatment described above, and may be any cleaning treatment that does not damage the substrate 2. In a case where the substrate 2 is a resin substrate, low-temperature baking at a temperature of, for example, 100 degrees or less may be performed after wet cleaning is performed. Step S01 corresponds to a first process.

Figure 5A:
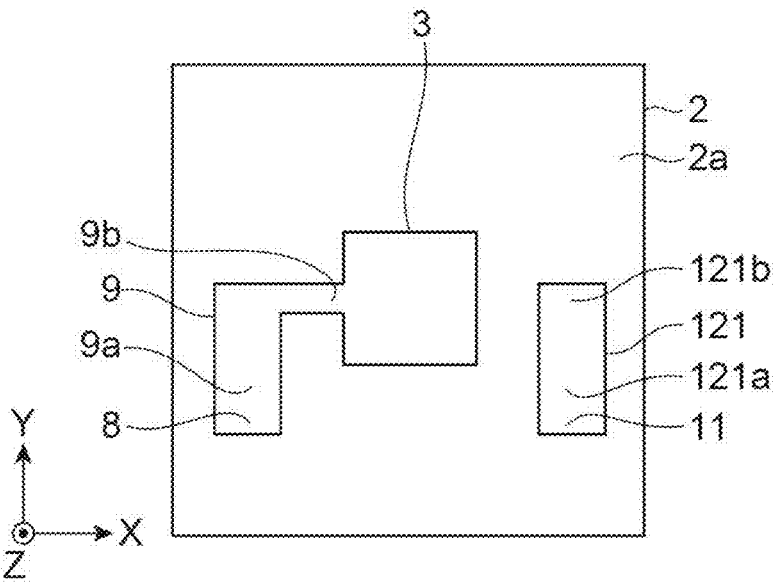
FIGS. 5A, 5B, 5C, and 5D are plan views of an intermediate in the method for manufacturing an organic semiconductor element illustrated in FIG. 4.

Subsequently, as illustrated in FIG. 5A, the first electrode 3, the first terminal 8, the first wiring 9, the second terminal 11, and the first portion 121 of the second wiring 12 are formed (step S02). Specifically, the first electrode 3, the first terminal 8, the first wiring 9, the second terminal 11, and the first portion 121 of the second wiring 12 are formed on the main surface 2a of the substrate 2. That is, in step S02, a process of forming the first electrode 3 on the main surface 2a, a process of forming the first terminal 8 on the main surface 2a, a process of forming the first wiring 9 on the main surface 2a, a process of forming the second terminal 11 on the main surface 2a, and a process of forming the first portion 121 of the second wiring 12 on the main surface 2a are performed. The first terminal 8, the first wiring 9, the second terminal 11, and the first portion 121 of the second wiring 12 are made of the material of the first electrode 3. Each of the first terminal 8, the first wiring 9, the second terminal 11, and the first portion 121 of the second wiring 12 is formed to have a thickness substantially equal to the thickness of the first electrode 3. The first electrode 3, the first terminal 8, the first wiring 9, the second terminal 11, and the first portion 121 of the second wiring 12 are simultaneously formed (that is, in the same process). The first electrode 3, the first terminal 8, and the first wiring 9 are integrally formed. The second terminal 11 and the first portion 121 of the second wiring 12 are integrally formed. In step S02, the process of forming the first terminal 8 on the main surface 2a corresponds to a second process, the process of forming the second terminal 11 on the main surface 2a corresponds to a ninth process, and the process of forming the first electrode 3 on the main surface 2a corresponds to a third process.

Figure 5B:
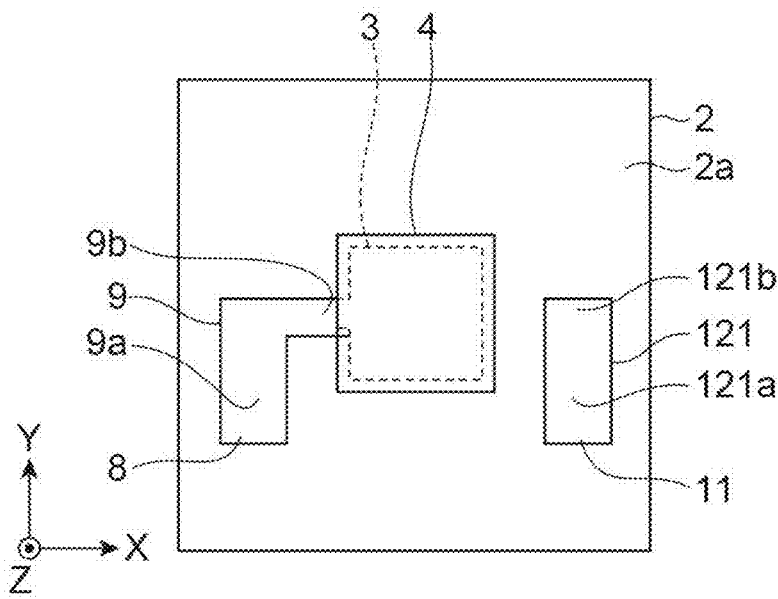

Subsequently, as illustrated in FIG. 5B, the first functional layer 4 is formed (step S03). Specifically, the first functional layer 4 is formed on the first electrode 3. At this time, in the first functional layer 4, the main body portion is formed on the first electrode 3, and the outer edge portion is formed on the main surface 2a. In step S03, a process of forming the first functional layer 4 on the first electrode 3 is performed. Step S03 corresponds to a tenth process.

Figure 5C:
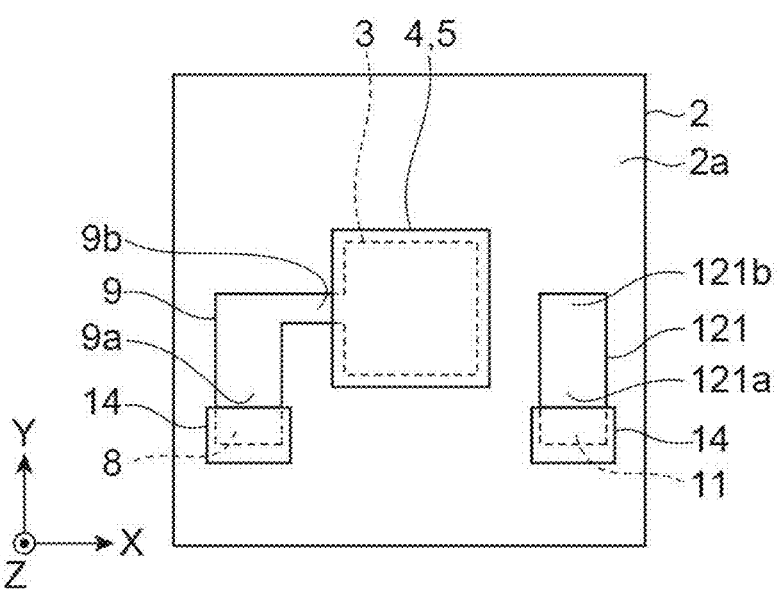

Subsequently, as illustrated in FIG. 5C, the organic semiconductor layer 5 and a sacrificial layer 14 are formed (step S04). Specifically, the organic semiconductor layer 5 is formed on the first functional layer 4, and the sacrificial layer 14 is formed in a predetermined region on the main surface 2a. At this time, in the organic semiconductor layer 5, the main body portion is formed on the first functional layer 4, and the outer edge portion is formed on the main surface 2a. As described above, since the first functional layer 4 is formed on the first electrode 3, the organic semiconductor layer 5 is formed on the first electrode 3. That is, in step S04, a process of forming the organic semiconductor layer 5 on the first electrode 3 and a process of forming the sacrificial layer 14 in the predetermined region on the main surface 2a are performed. Further, in the process of forming the organic semiconductor layer 5 on the first electrode 3, the organic semiconductor layer 5 is formed on the first functional layer 4. The organic semiconductor layer 5 and the predetermined region on the main surface 2a on which the sacrificial layer 14 is formed are apart from each other. That is, in step S04, the organic semiconductor layer 5 and the sacrificial layer 14 are formed apart from each other. In the present embodiment, the organic semiconductor layer 5 and the sacrificial layer 14 are formed apart from each other also as viewed from the Z-axis direction (that is, a direction perpendicular to the main surface 2a).

In the present embodiment, the predetermined region on the main surface 2a on which the sacrificial layer 14 is formed includes a region on the first terminal 8 and a region on the second terminal 11. Specifically, the predetermined region on the main surface 2a on which the sacrificial layer 14 is formed includes the entire region on the first terminal 8, the entire region on the second terminal 11, a partial region of the main surface 2a positioned around the first terminal 8, and a partial region on the main surface 2a positioned around the second terminal 11. Accordingly, in the present embodiment, the sacrificial layer 14 is formed on the first terminal 8, the second terminal 11, and the main surface 2a. Alternatively, the predetermined region on the main surface 2a on which the sacrificial layer 14 is formed may include only the region on the first terminal 8 and the region on the second terminal 11. In this case, the region on the first terminal 8 included in the predetermined region may be the entire region or only a part of the region. The region on the second terminal 11 included in the predetermined region may be the entire region or only a part of the region.

In the present embodiment, the sacrificial layer 14 is made of the material of the organic semiconductor layer 5. That is, in step S04, the sacrificial layer 14 made of a material identical to the organic semiconductor layer 5 is formed. As described above, the organic semiconductor layer 5 is made of the organic material containing the p-type organic semiconductor and the n-type organic semiconductor. Accordingly, the sacrificial layer 14 is also made of the organic material including the p-type organic semiconductor and the n-type organic semiconductor. Alternatively, the sacrificial layer 14 may be made of a material different from the material of the organic semiconductor layer 5. That is, in step S04, the sacrificial layer 14 made of a material different from the organic semiconductor layer 5 may be formed. A thickness of the sacrificial layer 14 is, for example, 100 nm or more and 10,000 nm or less. In this case, the thickness of the sacrificial layer 14 may be 500 nm or more and 10,000 nm or less.

In step S04, the sacrificial layer 14 is formed such that the thickness of the sacrificial layer 14 is equal to or more than the thickness of the first electrode 3. The sacrificial layer 14 is formed such that the thickness of the sacrificial layer 14 is equal to or more than the thickness of the second electrode 7. Furthermore, in step S04, the sacrificial layer 14 is formed such that a ratio of a length of the sacrificial layer 14 to the thickness of the sacrificial layer 14 is 100 or more and 10,000 or less. Here, the length of the sacrificial layer 14 includes at least one of a length of the sacrificial layer 14 in the X-axis direction or a length thereof in the Y-axis direction. Accordingly, in step S04, the sacrificial layer 14 may be formed such that a ratio of the length of the sacrificial layer 14 in the X-axis direction to the thickness of the sacrificial layer 14 is 100 or more and 10,000 or less, and the sacrificial layer 14 may be formed such that a ratio of the length of the sacrificial layer 14 in the Y-axis direction to the thickness of the sacrificial layer 14 is 100 or more and 10,000 or less. Alternatively, the sacrificial layer 14 may be formed such that the ratio of the length of the sacrificial layer 14 in the X-axis direction to the thickness of the sacrificial layer 14 and the ratio of the length of the sacrificial layer 14 in the Y-axis direction to the thickness of the sacrificial layer 14 are 100 or more and 10,000 or less.

In the present embodiment, the organic semiconductor layer 5 and the sacrificial layer 14 are simultaneously formed (that is, in the same process). Accordingly, in step S04, the process of forming the organic semiconductor layer 5 on the first electrode 3 and the process of forming the sacrificial layer 14 in the predetermined region on the main surface 2a are simultaneously performed. A method for forming the organic semiconductor layer 5 and the sacrificial layer 14 is, for example, a printing method, a spin coating method, or a vapor deposition method. The printing method for forming the organic semiconductor layer 5 and the sacrificial layer 14 is, for example, a dispenser method, an inkjet method, or screen printing. In a case where the sacrificial layer 14 is formed to have the above-described thickness and the organic semiconductor layer 5 and the sacrificial layer 14 are formed to be apart from each other, it is preferable that the dispenser method or the inkjet method is employed as the printing method. Accordingly, in the present embodiment, the organic semiconductor layer 5 and the sacrificial layer 14 are formed by the dispenser method or the inkjet method. In the present embodiment, the organic semiconductor layer 5 and the sacrificial layer 14 are formed by the printing method under identical conditions. In step S04, the process of forming the organic semiconductor layer 5 on the first electrode 3 corresponds to a fourth process, and the process of forming the sacrificial layer 14 in the predetermined region on the main surface 2a corresponds to a sixth process.

Figure 5D:
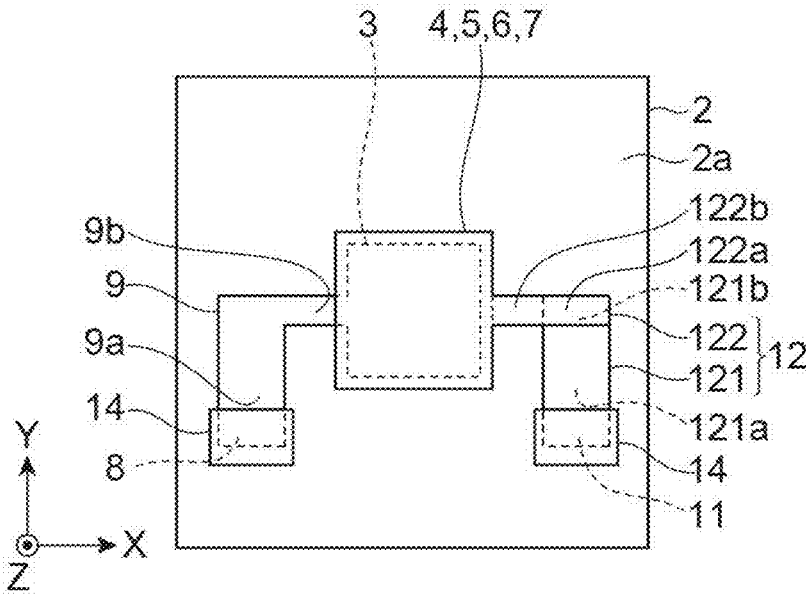

Subsequently, as illustrated in FIG. 5D, the second functional layer 6, the second electrode 7, and the second portion 122 of the second wiring 12 are formed (step S05). Specifically, the second functional layer 6 is formed on the organic semiconductor layer 5, the second electrode 7 is formed on the second functional layer 6, and the second portion 122 of the second wiring 12 is formed on the main surface 2a. As described above, since the second functional layer 6 is formed on the organic semiconductor layer 5, the second electrode 7 is formed on the organic semiconductor layer 5. Furthermore, in the second portion 122 formed on the main surface 2a, the other end 122b is connected to the second electrode 7 from the main surface 2a via the side surface (outer edge portion) of the organic semiconductor layer 5. That is, the second electrode 7 and the second wiring 12 are connected via the side surface of the organic semiconductor layer 5. In step S05, a process of forming the second functional layer 6 on the organic semiconductor layer 5, a process of forming the second electrode 7 on the organic semiconductor layer 5, and a process of forming the second portion 122 of the second wiring 12 on the main surface 2a are performed. Further, in the process of forming the second electrode 7 on the organic semiconductor layer 5, the second electrode 7 is formed on the second functional layer 6. In step S05, the process of forming the second functional layer 6 on the organic semiconductor layer 5, the process of forming the second electrode 7 on the organic semiconductor layer 5, and the process of forming the second portion 122 of the second wiring 12 on the main surface 2a are continuously performed. The second portion 122 of the second wiring 12 is made of the material of the second electrode 7. The second portion 122 of the second wiring 12 is formed to have a thickness substantially equal to the thickness of the second electrode 7. The second electrode 7 and the second portion 122 of the second wiring 12 are simultaneously and integrally formed. In step S05, the process of forming the second functional layer 6 on the organic semiconductor layer 5 corresponds to an eleventh process, and the process of forming the second electrode 7 on the organic semiconductor layer 5 corresponds to a fifth process.

After step S05 and before step S06, the thickness of the sacrificial layer 14 is equal to or more than the thickness of the first electrode 3 and equal to or more than the thickness of the second electrode 7. Furthermore, after step S05 and before step S06, the thickness of the sacrificial layer 14 is more than the thickness of the organic semiconductor layer 5. Further, as described above, in step S04, the organic semiconductor layer 5 and the predetermined region on the main surface 2a on which the sacrificial layer 14 is formed are apart from each other. Accordingly, after steps S04 and S05 and before step S06, the organic semiconductor layer 5 and the sacrificial layer 14 are apart from each other.

Figure 6A:
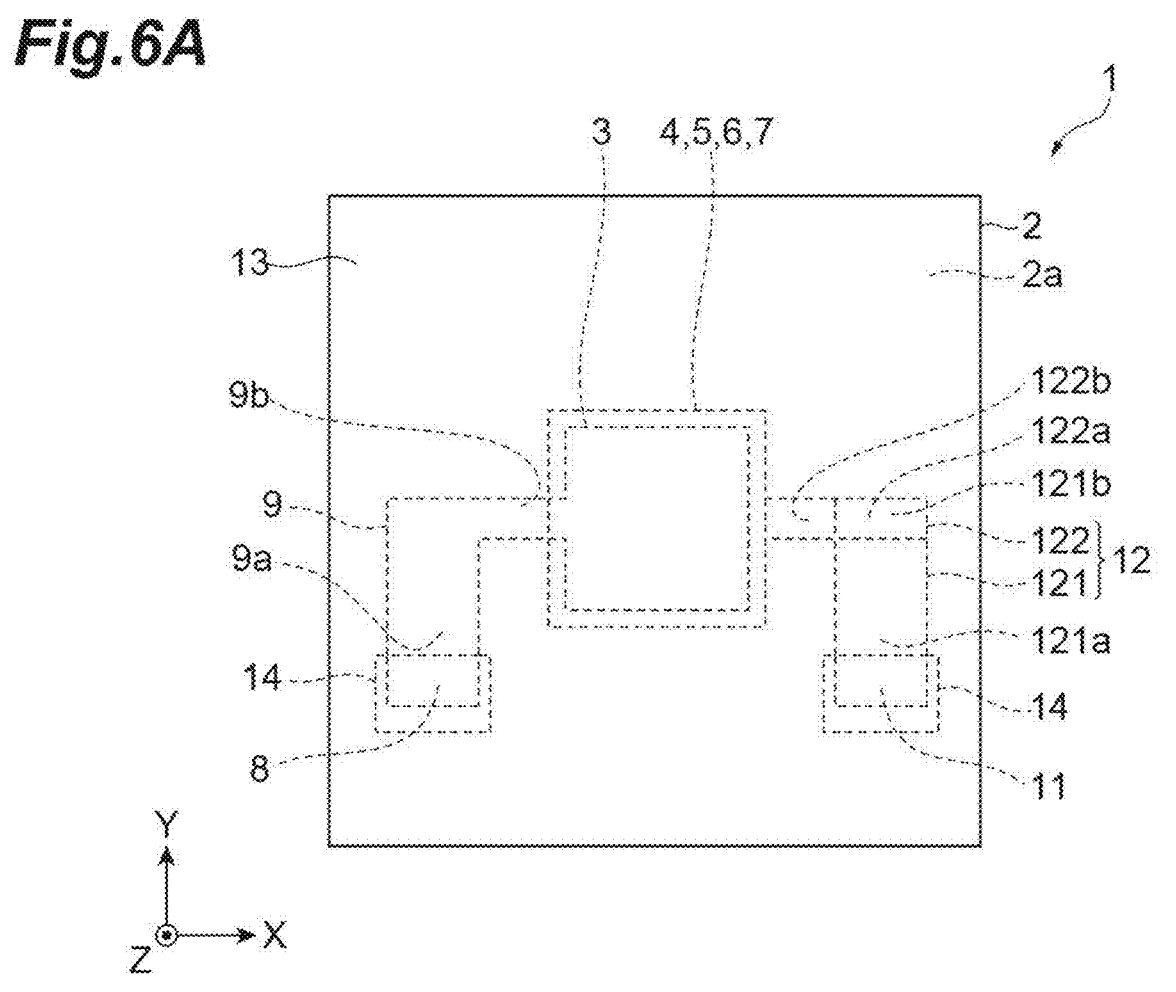
Figure 6B:
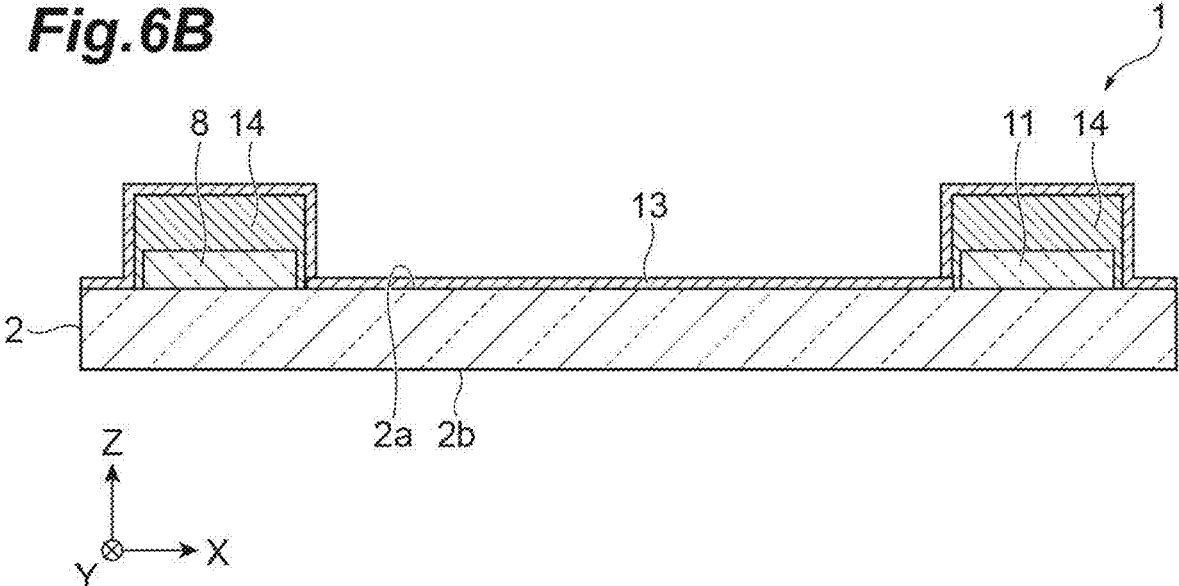
FIG. 6B is a cross-sectional view of the intermediate in the method for manufacturing an organic semiconductor element illustrated in FIG. 4.

Subsequently, as illustrated in FIGS. 6A and 6B, the barrier layer 13 is formed (step S06). Specifically, the barrier layer 13 is formed on the main surface 2a by the ALD method to cover the first terminal 8, the first electrode 3, the second electrode 7, the organic semiconductor layer 5, and the sacrificial layer 14. Further, the barrier layer 13 is also formed on the main surface 2*b* by the ALD method. That is, in step S06, a process of forming the barrier layer 13 on the main surface 2*a* by the ALD method to cover the first terminal 8, the first electrode 3, the second electrode 7, the organic semiconductor layer 5, and the sacrificial layer 14 and a process of forming the barrier layer 13 on the main surface 2*b* by the ALD method are performed. In step S06, the process of forming the barrier layer 13 on the main surface 2*a* by the ALD method and the process of forming the barrier layer 13 on the main surface 2*b* by the ALD method are simultaneously performed. In step S06, the barrier layer 13 is formed on the main surface 2*a* to cover the first terminal 8, the first wiring 9, the second terminal 11, the second wiring 12, the first electrode 3, the second electrode 7, the first functional layer 4, the second functional layer 6, the organic semiconductor layer 5, and the sacrificial layer 14 and is also formed on the main surface 2*b*. The thickness of the barrier layer 13 is, for example, 5 nm or more and 100 nm or less. In that case, the thickness of the barrier layer 13 may be 5 nm or more and 70 nm or less, or may be 5 nm or more and 40 nm or less. In step S06, the barrier layer 13 is formed such that the thickness of the barrier layer 13 is $\frac{1}{10}$ or less of the sum of the thickness of the first electrode 3, the thickness of the organic semiconductor layer 5, and the thickness of the second electrode 7.

The barrier layer 13 is formed by the ALD method as described above. In the present embodiment, the barrier layer 13 is formed by alternately laminating the plurality of first layers made of the first material and the plurality of second layers made of the second material one by one. In step S06, the process of forming the barrier layer 13 on the main surface 2*a* by the ALD method to cover the first terminal 8, the first electrode 3, the second electrode 7, the organic semiconductor layer 5, and the sacrificial layer 14 corresponds to a seventh process. After step S06, the thickness of the sacrificial layer 14 is 10 times or more the thickness of the barrier layer 13.

Subsequently, the sacrificial layer 14 and the barrier layer 13 are removed (step S07). Specifically, the sacrificial layer 14 and a portion of the barrier layer 13 that covers the sacrificial layer 14 are removed. That is, in step S07, a process of removing the sacrificial layer 14 and the portion of the barrier layer 13 that covers the sacrificial layer 14 is performed. In the present embodiment, the sacrificial layer 14 and the portion of the barrier layer 13 that covers the sacrificial layer 14 are removed by a solvent. Specifically, the portion of the barrier layer 13 that covers the sacrificial layer 14 is removed together with the sacrificial layer 14 by wiping the portion with a brush, a cloth, or the like containing a solvent that dissolves the sacrificial layer 14 and the barrier layer 13. As a result, the portion of the barrier layer 13 that covers the sacrificial layer 14 is removed together with the sacrificial layer 14, and an opening that exposes the predetermined region is formed in the barrier layer 13. As described above, in the present embodiment, since the predetermined region on the main surface 2*a* includes the region on the first terminal 8 and the region on the second terminal 11, the first opening 13*a* that exposes the first terminal 8 and the second opening 13*b* that exposes the second terminal 11 are formed in the barrier layer 13 by removing the sacrificial layer 14 and the portion of the barrier layer 13 that covers the sacrificial layer 14. As a result, the first terminal 8 is exposed to the outside through the first opening 13*a*, and the second terminal 11 is exposed to the outside through the second opening 13*b*. Step S07 corresponds to an eighth process.

As described above, in the method for manufacturing the organic semiconductor element 1, in a state where the organic semiconductor layer 5 and the sacrificial layer 14 are apart from each other, the sacrificial layer 14 and the portion of the barrier layer 13 that covers the sacrificial layer 14 are removed. As a result, it is possible to expose the predetermined region on the main surface 2*a* of the substrate 2 while damage or exposure of the organic semiconductor layer 5 is reduced. Thus, according to the method for manufacturing the organic semiconductor element 1, it is possible to expose the predetermined region on the substrate 2 while the organic semiconductor layer 5 is covered with the barrier layer 13.

In the method for manufacturing the organic semiconductor element 1, since the predetermined region on the main surface 2*a* includes the region on the first terminal 8 and the region on the second terminal 11, it is possible to expose the first terminal 8 and the second terminal 11 while the organic semiconductor layer 5 is covered with the barrier layer 13.

In the method for manufacturing the organic semiconductor element 1, since a formation of the organic semiconductor layer 5 and a formation of the sacrificial layer 14 are simultaneously performed, the organic semiconductor element 1 can be efficiently manufactured.

In the method for manufacturing the organic semiconductor element 1, since the organic semiconductor layer 5 and the sacrificial layer 14 are formed by the printing method under identical conditions, the organic semiconductor element 1 can be more efficiently manufactured.

In the method for manufacturing the organic semiconductor element 1, since the first functional layer 4 is formed on the first electrode 3 and the second functional layer 6 is formed on the organic semiconductor layer 5, a function as the organic semiconductor element 1 can be effectively exhibited.

In the method for manufacturing the organic semiconductor element 1, since the sacrificial layer 14 and the portion of the barrier layer 13 that covers the sacrificial layer 14 are removed by the solvent, the sacrificial layer 14 and the portion of the barrier layer 13 that covers the sacrificial layer 14 can be efficiently removed. In a case where the sacrificial layer 14 and the portion of the barrier layer 13 that covers the sacrificial layer 14 are removed by irradiation with a laser beam, it is necessary to employ a material that does not absorb the laser beam in selecting the material of the substrate 2 and the material of the barrier layer 13. On the other hand, in a case where the sacrificial layer 14 and the portion of the barrier layer 13 that covers the sacrificial layer 14 are removed by the solvent, it is not necessary to consider the above-described optical characteristics in selecting the material of the substrate 2 and the material of the barrier layer 13. Accordingly, according to the method for manufacturing the organic semiconductor element 1, a degree of freedom in the formation of the substrate 2 and a degree of freedom in the formation of the barrier layer 13, such as selection of a suitable material, can be increased.

In the method for manufacturing the organic semiconductor element 1, the barrier layer 13 is formed by alternately laminating the plurality of first layers made of the first material and the plurality of second layers made of the second material different from the first material one by one. In this case, for example, cracks generated in the barrier layer 13 in a manufacturing procedure of the organic semiconductor element 1 are hardly connected between the layers. Accordingly, according to the method for manufacturing the organic semiconductor element 1, the organic semiconductor layer 5 can be reliably sealed by the barrier layer 13.

In the method for manufacturing the organic semiconductor element 1, since the thickness of the sacrificial layer 14 is more than the thickness of the organic semiconductor layer 5, when the sacrificial layer 14 and the portion of the barrier layer 13 that covers the sacrificial layer 14 are removed, a defect is likely to occur in the portion of the barrier layer 13 that covers the sacrificial layer 14. Accordingly, according to the method for manufacturing the organic semiconductor element 1, the sacrificial layer 14 and the portion of the barrier layer 13 that covers the sacrificial layer 14 can be easily and reliably removed.

In the method for manufacturing the organic semiconductor element 1, the sacrificial layer 14 is formed such that the ratio of the length of the sacrificial layer 14 to the thickness of the sacrificial layer 14 is 100 or more and 10,000 or less. In this case, when the sacrificial layer 14 and the portion of the barrier layer 13 that covers the sacrificial layer 14 are removed, the defect is likely to occur in the portion of the barrier layer 13 that covers the sacrificial layer 14. Accordingly, according to the method for manufacturing the organic semiconductor element 1, the sacrificial layer 14 and the portion of the barrier layer 13 that covers the sacrificial layer 14 can be easily and reliably removed.

In the method for manufacturing the organic semiconductor element 1, since the thickness of the sacrificial layer 14 is 10 times or more the thickness of the barrier layer 13, when the sacrificial layer 14 and the portion of the barrier layer 13 that covers the sacrificial layer 14 are removed, the defect is likely to occur in the portion of the barrier layer 13 that covers the sacrificial layer 14. Accordingly, according to the method for manufacturing the organic semiconductor element 1, the sacrificial layer 14 and the portion of the barrier layer 13 that covers the sacrificial layer 14 can be easily and reliably removed.

In the method for manufacturing the organic semiconductor element 1, since the thickness of the sacrificial layer 14 is equal to or more than the thickness of the first electrode 3, the sacrificial layer 14 and the portion of the barrier layer 13 that covers the sacrificial layer 14 can be easily and reliably removed.

In the method for manufacturing the organic semiconductor element 1, since the thickness of the sacrificial layer 14 is equal to or more than the thickness of the second electrode 7, the sacrificial layer 14 and the portion of the barrier layer 13 that covers the sacrificial layer 14 can be easily and reliably removed.

In the method for manufacturing the organic semiconductor element 1, since the barrier layer 13 is formed such that the thickness of the barrier layer 13 is 1/10 or less of the sum of the thickness of the first electrode 3, the thickness of the organic semiconductor layer 5, and the thickness of the second electrode 7, the portion of the barrier layer 13 that covers the sacrificial layer 14 can be easily and reliably removed.

Figure 7:
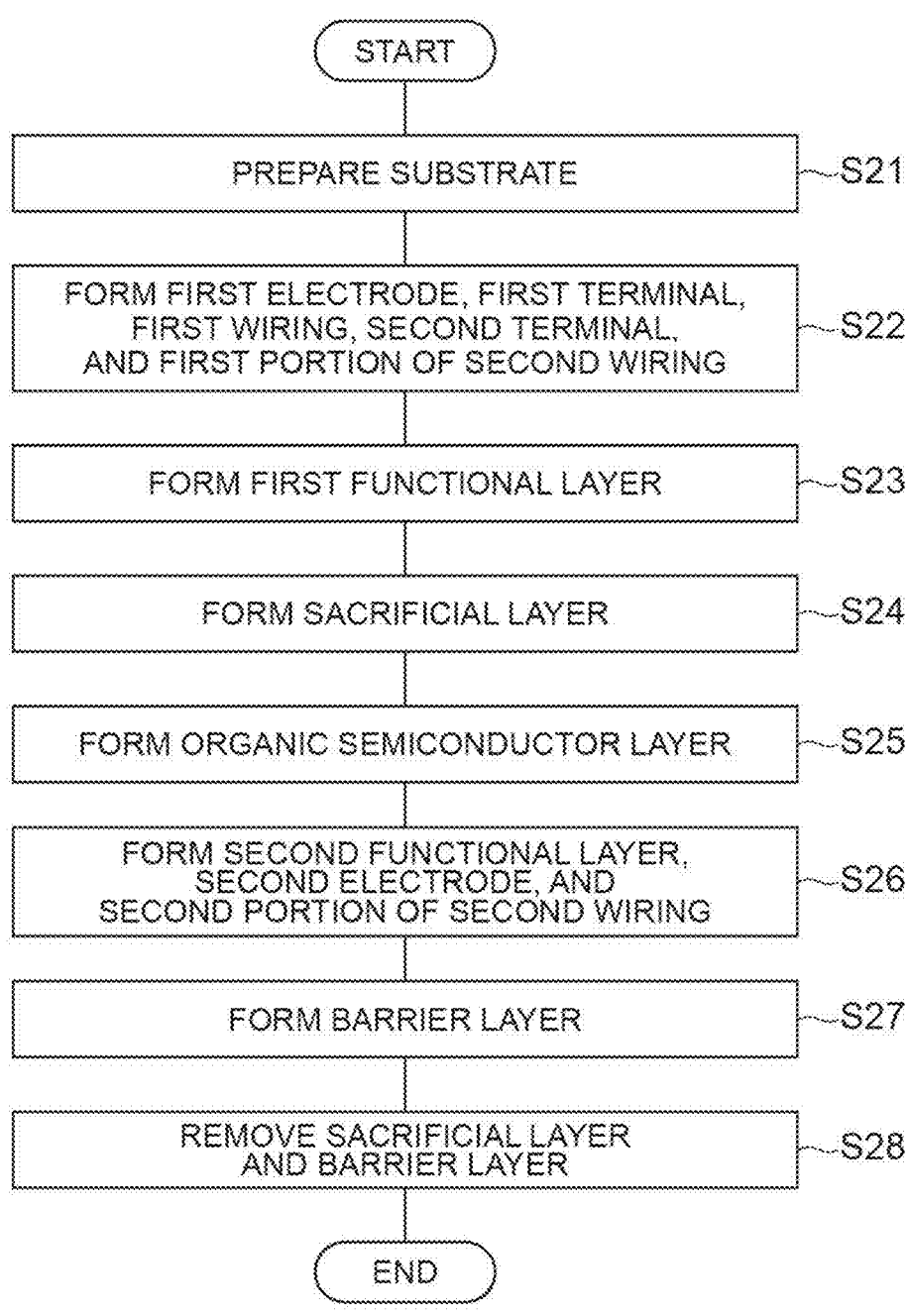
FIG. 7 is a flowchart of a method for manufacturing an organic semiconductor element according to a first modification.

A method for manufacturing the organic semiconductor element 1 according to a first modification will be described with reference to the flowchart of FIG. 7. In the first modification, an order of forming the organic semiconductor layer 5 and the sacrificial layer 14 is different from the above-described embodiment. Hereinafter, differences between the above-described embodiment and the first modification will be mainly described.

First, the substrate 2 having the main surface 2a is prepared (step S21). Step S21 corresponds to the first process.

Figure 8A:
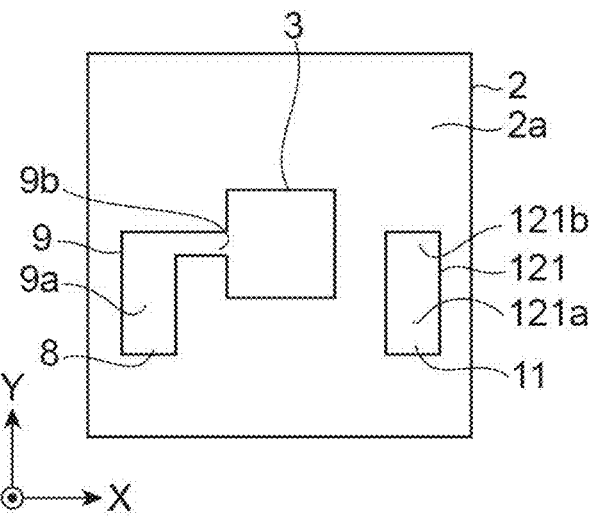
FIGS. 8A, 8B, 8C, 8D, and 8E are plan views of an intermediate in the method for manufacturing an organic semiconductor element illustrated in FIG. 7.

Subsequently, as illustrated in FIG. 8A, the first electrode 3, the first terminal 8, the first wiring 9, the second terminal 11, and the first portion 121 of the second wiring 12 are formed (step S22). In step S22, the process of forming the first electrode 3 on the main surface 2a, the process of forming the first terminal 8 on the main surface 2a, the process of forming the first wiring 9 on the main surface 2a, the process of forming the second terminal 11 on the main surface 2a, and the process of forming the first portion 121 of the second wiring 12 on the main surface 2a are performed. In step S22, the process of forming the first terminal 8 on the main surface 2a corresponds to the second process, the process of forming the second terminal 11 on the main surface 2a corresponds to the ninth process, and the process of forming the first electrode 3 on the main surface 2a corresponds to the third process.

Figure 8B:
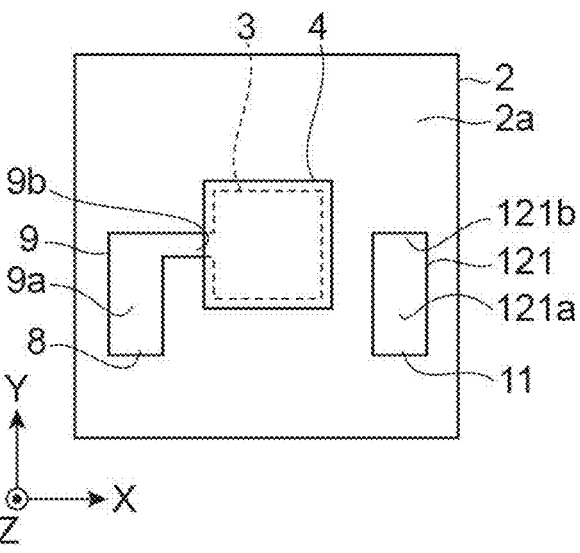

Subsequently, as illustrated in FIG. 8B, the first functional layer 4 is formed (step S23). Specifically, the first functional layer 4 is formed on the first electrode 3. That is, in step S23, the process of forming the first functional layer 4 on the first electrode 3 is performed. Step S23 corresponds to the tenth process.

Figure 8C:
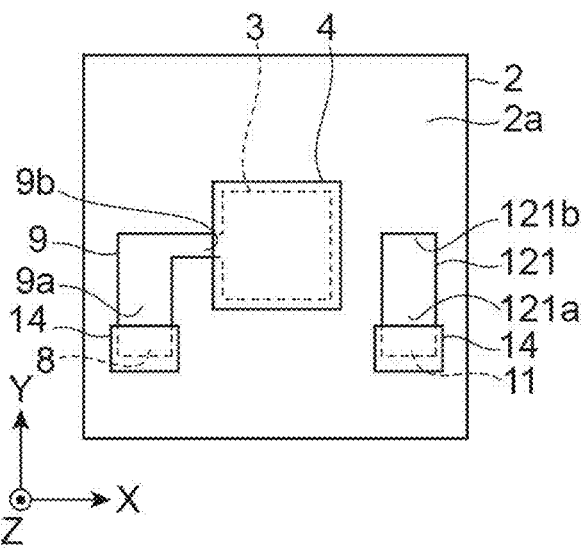

Subsequently, as illustrated in FIG. 8C, the sacrificial layer 14 is formed (step S24). Specifically, the sacrificial layer 14 is formed in the predetermined region on the main surface 2a, and the predetermined region includes the region on the first terminal 8 and the region on the second terminal 11. That is, in step S24, the sacrificial layer 14 is formed on the first terminal 8 and the second terminal 11. Step S24 corresponds to the sixth process.

Figure 8D:
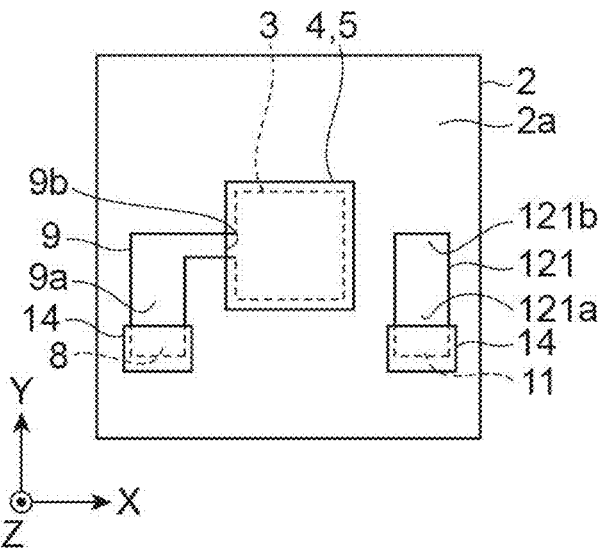

Subsequently, as illustrated in FIG. 8D, the organic semiconductor layer 5 is formed (step S25). Specifically, the organic semiconductor layer 5 is formed on the first functional layer 4. In the first modification, since the first functional layer 4 is formed on the first electrode 3 as described above, that the organic semiconductor layer 5 is formed on the first electrode 3. Step S25 corresponds to the fourth process.

In the first modification, as described above, the process of forming the organic semiconductor layer 5 and the process of forming the sacrificial layer 14 are separately performed. Specifically, after step S24 is performed, step S25 is performed. Accordingly, in the first modification, the organic semiconductor layer 5 is formed on the first functional layer 4 after the sacrificial layer 14 is formed in the predetermined region on the main surface 2a.

In the first modification, the method for forming the organic semiconductor layer 5 and the sacrificial layer 14 is a printing method, the organic semiconductor layer 5 is formed by a printing method under a first condition, and the sacrificial layer 14 is formed by a printing method under a second condition different from the first condition. That is, the organic semiconductor layer 5 and the sacrificial layer 14 are formed by printing methods under different conditions.

Figure 8E:
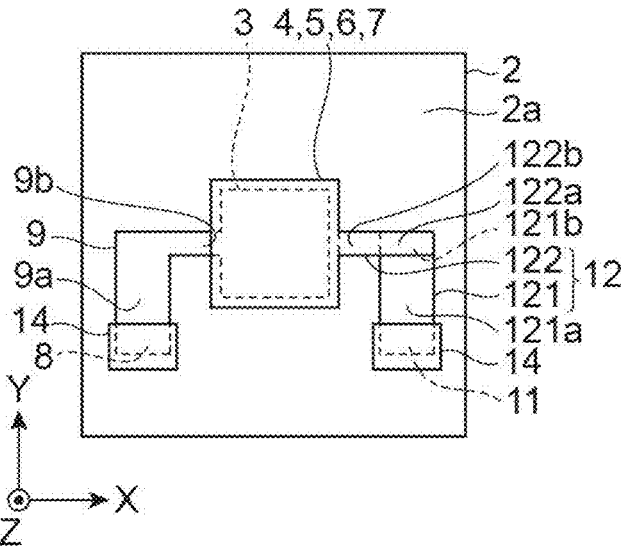

Subsequently, as illustrated in FIG. 8E, the second functional layer 6, the second electrode 7, and the second portion 122 of the second wiring 12 are formed (step S26). Specifically, the second functional layer 6 is formed on the organic semiconductor layer 5, the second electrode 7 is formed on the second functional layer 6, and the second portion 122 of the second wiring 12 is formed on the main surface 2a. In the first modification, since the second functional layer 6 is formed on the organic semiconductor layer 5 as described above, that the second electrode 7 is formed on the organic semiconductor layer 5. That is, in step S25, the process of forming the second functional layer 6 on the organic semiconductor layer 5, the process of forming the second electrode 7 on the organic semiconductor layer 5, and the process of forming the second portion 122 of the second wiring 12 on the main surface 2a are performed. Further, in the process of forming the second electrode 7 on the organic semiconductor layer 5, the second electrode 7 is formed on the second functional layer 6. In step S26, the process of forming the second functional layer 6 on the organic semiconductor layer 5 corresponds to the eleventh process, and the process of forming the second electrode 7 on the organic semiconductor layer 5 corresponds to the fifth process.

Subsequently, the barrier layer 13 is formed (step S27). Specifically, the barrier layer 13 is formed on the main surface 2a by the ALD method to cover the first terminal 8, the first wiring 9, the second terminal 11, the second wiring 12, the first electrode 3, the second electrode 7, the first functional layer 4, the second functional layer 6, the organic semiconductor layer 5, and the sacrificial layer 14. Further, the barrier layer 13 is also formed on the main surface 2b by the ALD method. That is, in step S27, the process of forming the barrier layer 13 on the main surface 2a by the ALD method to cover the first terminal 8, the first electrode 3, the second electrode 7, the organic semiconductor layer 5, and the sacrificial layer 14 and the process of forming the barrier layer 13 on the main surface 2b by the ALD method are performed. The process of forming the barrier layer 13 on the main surface 2a by the ALD method to cover the first terminal 8, the first electrode 3, the second electrode 7, the organic semiconductor layer 5, and the sacrificial layer 14 in step S27 corresponds to the seventh process.

Subsequently, the sacrificial layer 14 and the barrier layer 13 are removed (step S28). Specifically, the sacrificial layer 14 and the portion of the barrier layer 13 that covers the sacrificial layer 14 are removed. That is, in step S28, the process of removing the sacrificial layer 14 and the portion of the barrier layer 13 that covers the sacrificial layer 14 is performed. Step S28 corresponds to the eighth process.

In the first modification, since the process of forming the organic semiconductor layer 5 and the process of forming the sacrificial layer 14 are separately performed, the organic semiconductor layer 5 and the sacrificial layer 14 can be formed in a mode suitable for each.

In the first modification, since the organic semiconductor layer 5 is formed by the printing method under the first condition and the sacrificial layer 14 is formed by the printing method under the second condition different from the first condition, the organic semiconductor layer 5 and the sacrificial layer 14 can be formed in a mode suitable for each.

Figure 9:
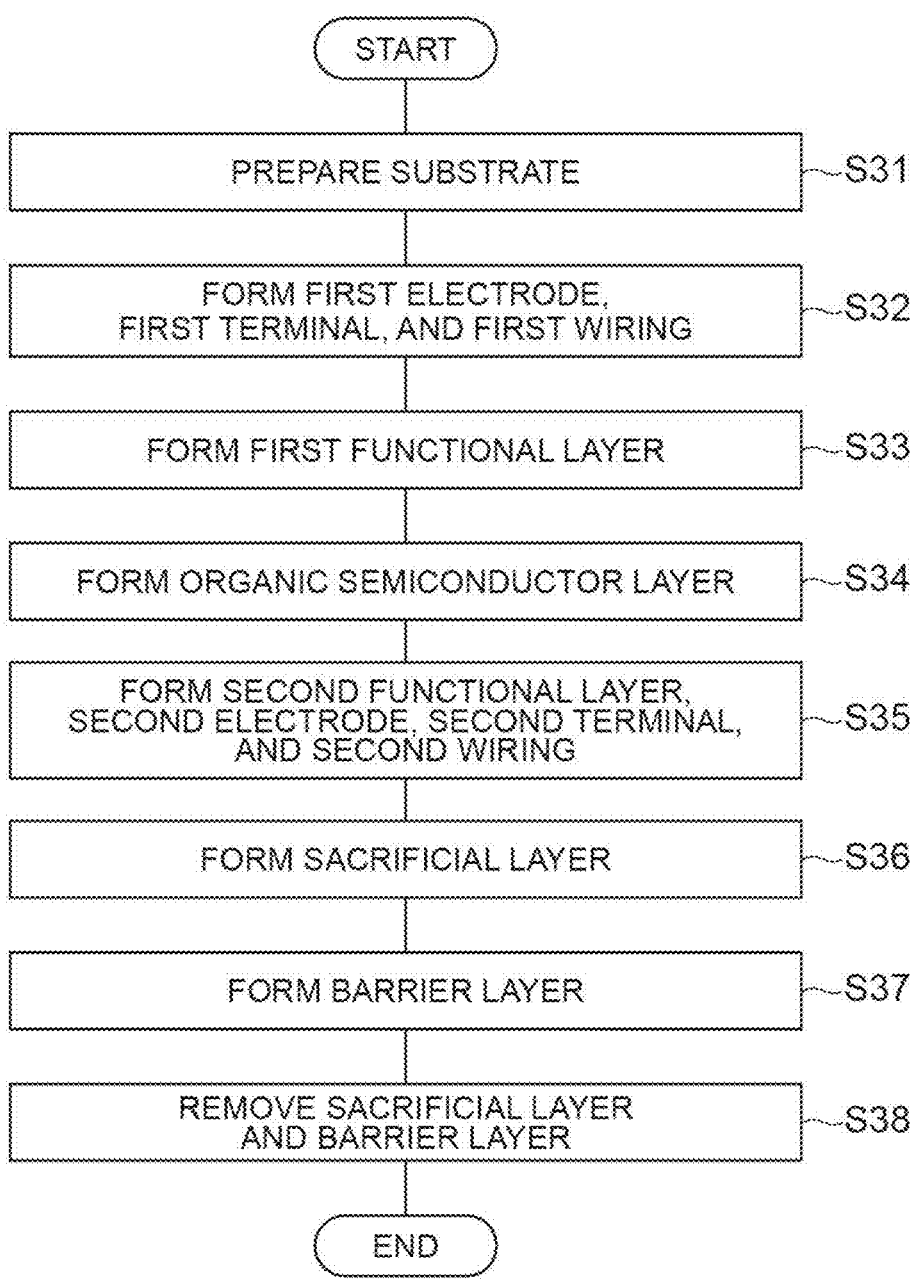
FIG. 9 is a flowchart of a method for manufacturing an organic semiconductor element according to a second modification.

A method for manufacturing the organic semiconductor element 1 according to a second modification will be described with reference to the flowchart shown in FIG. 9. In the second modification, an order of forming the organic semiconductor layer 5, the second electrode 7, the second wiring 12, and the sacrificial layer 14 is different from the above-described embodiment. Further, in the second modification, the formation of the second wiring is also different from the above-described embodiment. Hereinafter, differences between the above-described embodiment and the second modification will be mainly described.

First, the substrate 2 having the main surface 2a is prepared (step S31). Step S31 corresponds to the first process.

Figure 10A:
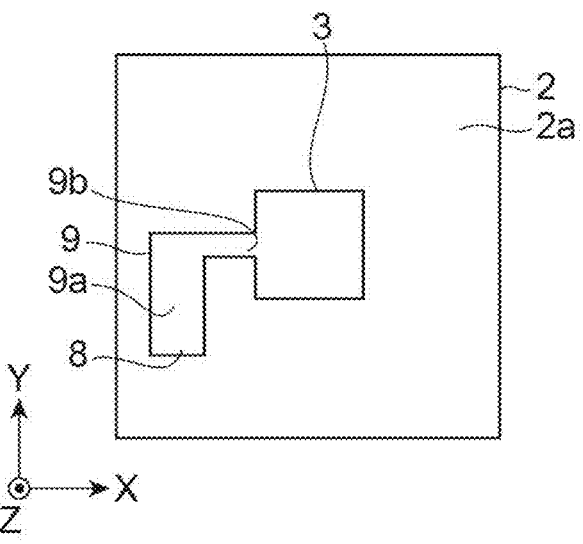
FIGS. 10A, 10B, 10C, 10D, and 10E are plan views of an intermediate in the method for manufacturing an organic semiconductor element illustrated in FIG. 9.

Subsequently, as illustrated in FIG. 10A, the first electrode 3, the first terminal 8, and the first wiring 9 are formed (step S32). Specifically, the first electrode 3, the first terminal 8, and the first wiring 9 are formed on the main surface 2a. That is, in step S32, the process of forming the first electrode 3 on the main surface 2a, the process of forming the first terminal 8 on the main surface 2a, and the process of forming the first wiring 9 on the main surface 2a are performed. The first electrode 3, the first terminal 8, and the first wiring 9 are simultaneously and integrally formed. In step S32, the process of forming the first terminal 8 on the main surface 2a corresponds to the second process.

Figure 10B:
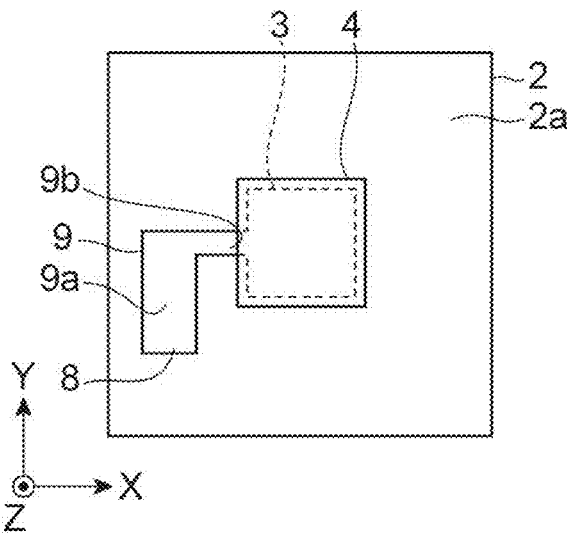

Subsequently, as illustrated in FIG. 10B, the first functional layer 4 is formed (step S33). Specifically, the first functional layer 4 is formed on the first electrode 3. That is, in step S33, the process of forming the first functional layer 4 on the first electrode 3 is performed. Step S33 corresponds to the tenth process.

Figure 10C:
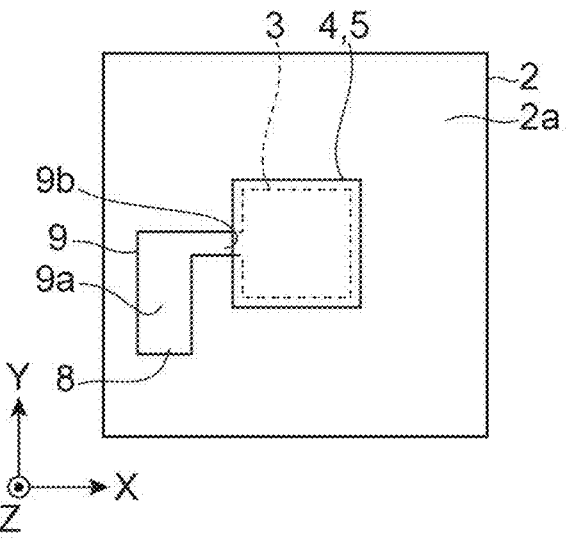

Subsequently, as illustrated in FIG. 10C, the organic semiconductor layer 5 is formed (step S34). Specifically, the organic semiconductor layer 5 is formed on the first functional layer 4. In the second modification, since the first functional layer 4 is formed on the first electrode 3 as described above, the organic semiconductor layer 5 is formed on the first electrode 3. That is, in step S34, the process of forming the organic semiconductor layer 5 on the first electrode 3 is performed. Step S34 corresponds to the fourth process.

Figure 10D:
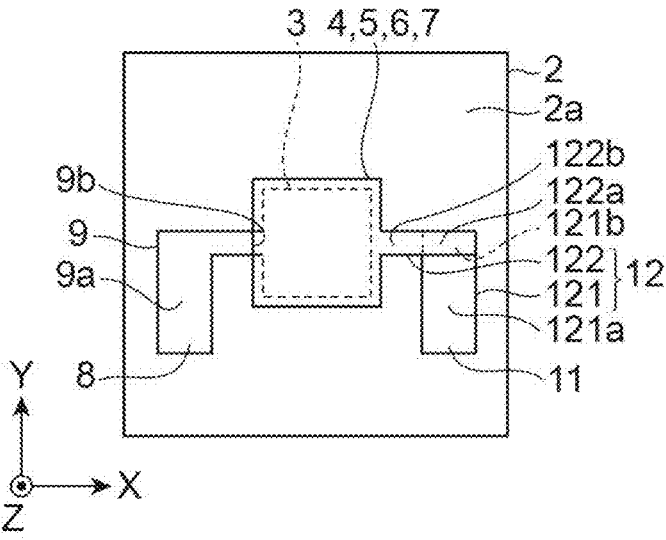

Subsequently, as illustrated in FIG. 10D, the second functional layer 6, the second electrode 7, the second terminal 11, and the second wiring 12 are formed (step S35). Specifically, the second functional layer 6 is formed on the organic semiconductor layer 5, the second electrode 7 is formed on the second functional layer 6, and the second terminal 11 and the second wiring 12 are formed on the main surface 2a. In the second modification, since the second functional layer 6 is formed on the organic semiconductor layer 5 as described above, the second electrode 7 is formed on the organic semiconductor layer 5. That is, in step S35, the process of forming the second functional layer 6 on the organic semiconductor layer 5, the process of forming the second electrode 7 on the organic semiconductor layer 5, and a process of forming the second wiring 12 on the main surface 2a are performed. Further, in the process of forming the second electrode 7 on the organic semiconductor layer 5, the second electrode 7 is formed on the second functional layer 6. The second wiring 12 is made of the material of the second electrode 7. The second electrode 7 and the second wiring 12 are simultaneously and integrally formed. In step S34, the process of forming the second functional layer 6 on the organic semiconductor layer 5 corresponds to the eleventh process, and the process of forming the second electrode 7 on the organic semiconductor layer 5 corresponds to the fifth process.

Figure 10E:
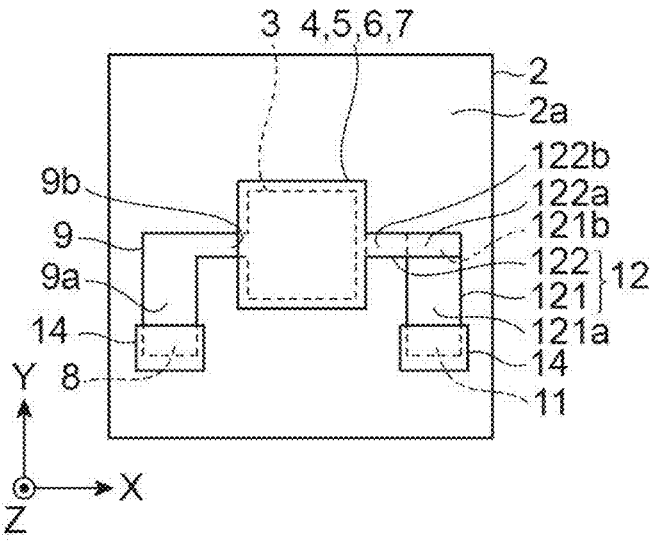

Subsequently, as illustrated in FIG. 10E, the sacrificial layer 14 is formed (step S36). Specifically, the sacrificial layer 14 is formed in the predetermined region on the main surface 2a, and the predetermined region includes the region on the first terminal 8 and the region on the second terminal 11. That is, in step S36, the sacrificial layer 14 is formed on the first terminal 8 and the second terminal 11. Step S36 corresponds to the sixth process.

Subsequently, the barrier layer 13 is formed (step S37). Specifically, the barrier layer 13 is formed on the main surface 2a by the ALD method to cover the first terminal 8, the first wiring 9, the second terminal 11, the second wiring 12, the first electrode 3, the second electrode 7, the first functional layer 4, the second functional layer 6, the organic semiconductor layer 5, and the sacrificial layer 14. Further, the barrier layer 13 is also formed on the main surface 2b by the ALD method. That is, in step S37, the process of forming the barrier layer 13 on the main surface 2a by the ALD method to cover the first terminal 8, the first electrode 3, the second electrode 7, the organic semiconductor layer 5, and the sacrificial layer 14 and the process of forming the barrier layer 13 on the main surface 2b by the ALD method are performed. In step S37, the process of forming the barrier layer 13 on the main surface 2a by the ALD method to cover the first terminal 8, the first electrode 3, the second electrode 7, the organic semiconductor layer 5, and the sacrificial layer 14 corresponds to the seventh process.

Subsequently, the sacrificial layer 14 and the barrier layer 13 are removed (step S38). Specifically, the sacrificial layer 14 and the portion of the barrier layer 13 that covers the sacrificial layer 14 are removed. That is, in step S38, the process of removing the sacrificial layer 14 and the portion of the barrier layer 13 that covers the sacrificial layer 14 is performed. Step S38 corresponds to the eighth process.

In the second modification, after the second functional layer 6, the second electrode 7, the second terminal 11, and the second wiring 12 are formed in step S35, the sacrificial layer 14 is formed in step S36. In this case, the second electrode 7, the second terminal 11, and the second wiring 12 can be simultaneously and integrally formed. Accordingly, according to the second modification, a degree of freedom in the formation of the second electrode 7, such as selection of a suitable material, can be increased.

A method for manufacturing the organic semiconductor element 1 according to a third modification will be described. In the third modification, the predetermined region on the main surface 2a on which the sacrificial layer 14 is formed is different from the above-described embodiment. Hereinafter, differences between the above-described embodiment and the third modification will be mainly described.

Figure 11:
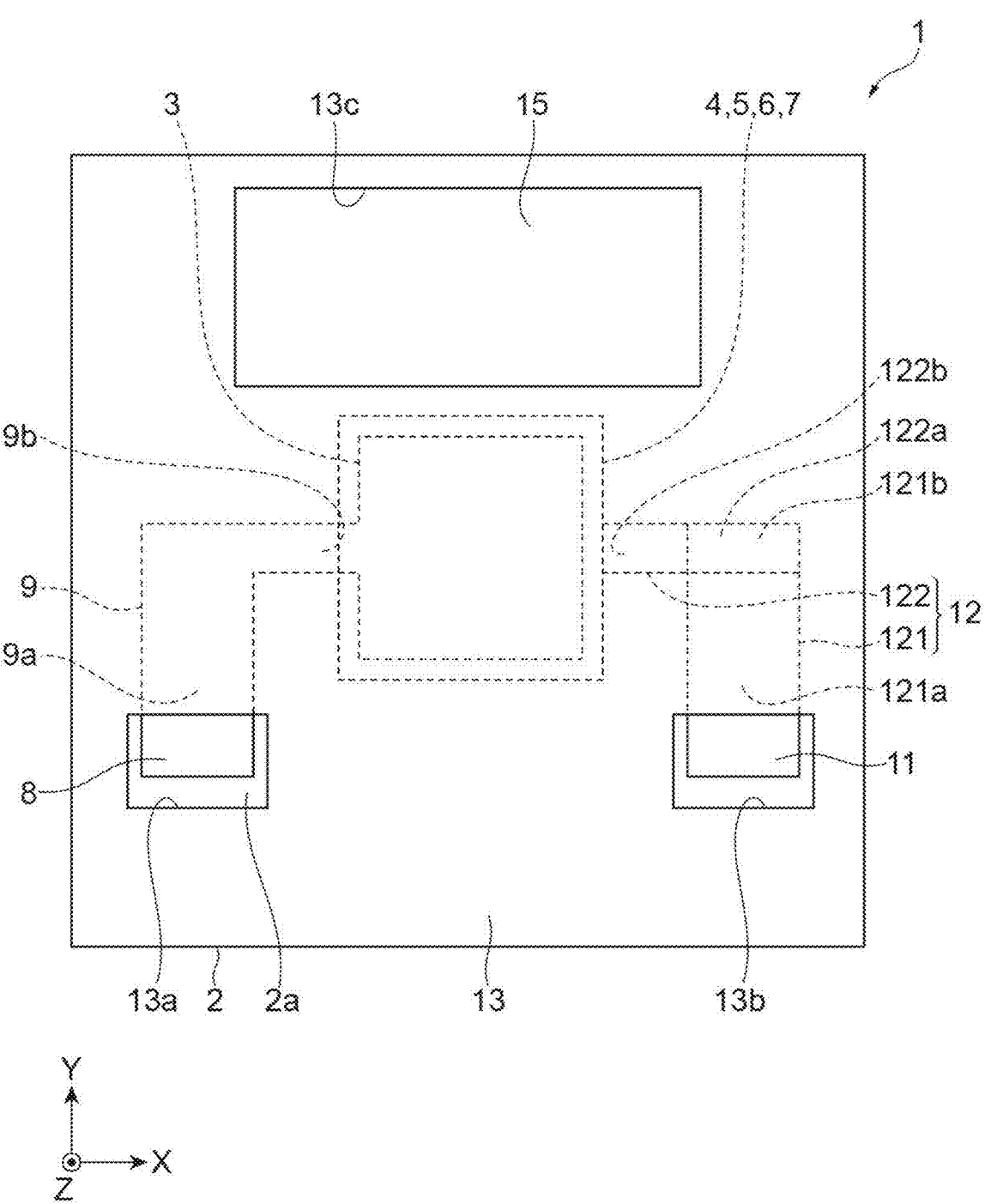
FIG. 11 is a plan view of an organic semiconductor element manufactured by a method for manufacturing an organic semiconductor element according to a third modification.

As illustrated in FIG. 11, in the third modification, a transmission window 15 for transmitting light is formed on the main surface 2a of the substrate 2. For example, the transmission window 15 is used when light emitted from the main surface 2b side of the substrate 2 is caused to be incident on a sample arranged on the main surface 2a side of the substrate 2 to obtain a signal from the sample is acquired. Accordingly, the transmission window 15 is a window for transmitting light emitted from the main surface 2b side of the substrate 2. For example, a phosphor or a wavelength filter may be used for the transmission window 15. In the third modification, the predetermined region where the sacrificial layer 14 is formed further includes a region on the transmission window 15 in addition to the region on the first terminal 8 and the region on the second terminal 11. Accordingly, the sacrificial layer 14 is also formed on the transmission window 15 in addition to the first terminal 8 and the second terminal 11. In this case, the sacrificial layer 14 and the portion of the barrier layer 13 that covers the sacrificial layer 14 are removed, and thus, as illustrated in FIG. 11, a third opening 13c that exposes the transmission window 15 is formed in the barrier layer 13 in addition to the first opening 13a that exposes the first terminal 8 and the second opening 13b that exposes the second terminal 11. As a result, the transmission window 15 is exposed to the outside through the third opening 13c.

As described above, the transmission window 15 is a window for transmitting light emitted from the main surface 2b side of the substrate 2. In a case where the transmission window 15 is covered with the barrier layer 13, there is a concern that light transmittance decreases. In the third modification, since the predetermined region where the sacrificial layer 14 is formed further includes the region on the transmission window 15, it is possible to expose the transmission window 15. Thus, according to the third modification, it is possible to reduces the decrease in the light transmittance in the transmission window 15.

Although the embodiment and the modifications of the present disclosure have been described above, the present disclosure is not limited to the above embodiment and the modifications. For example, in the embodiment and the modifications, the organic semiconductor element 1 may be a light receiving element or a light emitting element. In a case where the organic semiconductor element 1 is the light receiving element, light may be incident from the main surface 2b side of the substrate 2, or light may be incident from the main surface 2a side of the substrate 2.

Furthermore, the material of the first electrode 3 and the material of the second electrode 7 are not limited to the combination in the embodiment and the modifications. That is, the material of the first electrode 3 and the material of the second electrode 7 may be an identical material. Alternatively, the material of the first electrode 3 and the material of the second electrode 7 may be exchanged.

Furthermore, in the embodiment and the modifications, although the first functional layer 4 is formed on the first electrode 3 and the second functional layer 6 is formed on the organic semiconductor layer 5, a position where the first functional layer 4 is formed and a position where the second functional layer 6 is formed are not limited to the above-described positions. The first functional layer 4 may be formed on the first terminal 8 and the first wiring 9 in addition to the first electrode 3. The second functional layer 6 may be formed not only on the organic semiconductor layer 5 but also under the second terminal 11 and under the second wiring 12. That is, the second functional layer 6 may also be formed between the main surface 2a and the second terminal 11 and between the main surface 2a and the second wiring 12.

Furthermore, in the embodiment and the modifications, although the organic semiconductor element 1 includes the first functional layer 4 and the second functional layer 6, the organic semiconductor element 1 may not include the first functional layer 4 and the second functional layer 6. In this case, the organic semiconductor layer 5 is formed directly on the first electrode 3, and the second electrode 7 is formed directly on the organic semiconductor layer 5. Alternatively, the organic semiconductor element 1 may include only one of the first functional layer 4 and the second functional layer 6. In a case where the organic semiconductor element 1 includes only the first functional layer 4, the second electrode 7 is formed directly on the organic semiconductor layer 5, and in a case where the organic semiconductor element 1 includes only the second functional layer 6, the organic semiconductor layer 5 is formed directly on the first electrode 3.

Furthermore, in the embodiment and the modifications, although the outer edge portion of the organic semiconductor layer 5 surrounds the entire circumference of the first electrode 3 as viewed from the Z-axis direction, an arrangement of the outer edge portion of the organic semiconductor layer 5 is not limited to the above-described arrangement. The outer edge portion of the organic semiconductor layer 5 only needs to be arranged at least on the second wiring 12 side as viewed from the Z-axis direction, and may not surround the entire circumference of the first electrode 3.

Furthermore, in the embodiment and the modifications, although the organic semiconductor element 1 includes the second terminal 11 and the second wiring 12, the organic semiconductor element 1 may not include the second terminal 11 and the second wiring 12. In this case, the second electrode 7 also functions as the second terminal. In a case where the second electrode 7 also functions as the second terminal, the predetermined region on the main surface 2a on which the sacrificial layer 14 is formed includes the region on the first terminal 8 and a region on the second electrode 7. That is, in a case where the second electrode 7 also functions as the terminal, the sacrificial layer 14 is formed on the first terminal 8 and the second electrode 7.

Furthermore, in the embodiment and the modifications, although the barrier layer 13 is formed on the main surface 2a and the main surface 2b of the substrate 2, the barrier layer 13 may be formed only on the main surface 2a of the substrate 2. In this case, before the barrier layer 13 is formed, the main surface 2b may be covered with, for example, a tape. As a result, the barrier layer 13 is formed only on the main surface 2a of the substrate 2.

Furthermore, in the embodiment and the modifications, although the sacrificial layer 14 and the portion of the barrier layer 13 that covers the sacrificial layer 14 are removed by the solvent, a method of removing the sacrificial layer 14 and the portion of the barrier layer 13 that covers the sacrificial layer 14 is not limited to the above-described method. For example, the sacrificial layer 14 and the portion of the barrier layer 13 that covers the sacrificial layer 14 may be removed by applying only a physical impact without using the solvent.

Furthermore, in the embodiment and the modifications, the plurality of processes may be continuously performed, or the plurality of processes may be performed at time intervals.

A timing at which the first electrode 3, the first terminal 8, the first wiring 9, the second terminal 11, and the first portion 121 of the second wiring 12 are formed is not limited to the above-described timing. For example, the first electrode 3, the first terminal 8, the first wiring 9, the second terminal 11, and the first portion 121 of the second wiring 12 may be formed in advance on the main surface 2a of the substrate 2 to store the substrate 2. Alternatively, at least one of the first electrode 3, the first terminal 8, the first wiring 9, the second terminal 11, and the first portion 121 of the second wiring 12 may be formed in advance on the main surface 2a of the substrate 2 to store the substrate 2. After the substrate 2 is stored, subsequent processes may be performed at time intervals. Alternatively, after the substrate 2 in which at least one of the first electrode 3, the first terminal 8, the first wiring 9, the second terminal 11, and the first portion 121 of the second wiring 12 is formed on the main surface 2a in advance is prepared, the subsequent processes may be performed. In these cases, it is preferable that the processes after the process of forming the organic semiconductor layer 5 on the first electrode 3 are continuously performed.

A method for manufacturing an organic semiconductor element according to one aspect of the present disclosure is [1] "a method for manufacturing an organic semiconductor element including a first process of preparing a substrate having a main surface, a second process of forming a first terminal on the main surface at least after the first process, a third process of forming a first electrode to be electrically connected to the first terminal on the main surface at least after the first process, a fourth process of forming an organic semiconductor layer on the first electrode at least after the third process, a fifth process of forming a second electrode on the organic semiconductor layer at least after the fourth process, a sixth process of forming a sacrificial layer made of an organic material identical to the organic semiconductor layer in a predetermined region on the main surface at least after the first process, a seventh process of forming a barrier layer on the main surface by an ALD method to cover the first terminal, the first electrode, the second electrode, the organic semiconductor layer, and the sacrificial layer after the second process, the fifth process, and the sixth process, and an eighth process of removing the sacrificial layer and a portion of the barrier layer that covers the sacrificial layer after the seventh process. The organic semiconductor layer and the sacrificial layer are apart from each other after the second process, the fifth process, and the sixth process and before the seventh process.".

In the method for manufacturing an organic semiconductor element according to [1], in a state where the organic semiconductor layer and the sacrificial layer are apart from each other, the sacrificial layer and the portion of the barrier layer that covers the sacrificial layer are removed. As a result, it is possible to expose the predetermined region on the main surface of the substrate while damage or exposure of the organic semiconductor layer is reduced. Thus, according to the method for manufacturing an organic semiconductor element according to [1], it is possible to expose the predetermined region on the substrate while the organic semiconductor layer is covered with the barrier layer.

The method for manufacturing an organic semiconductor element according to one aspect of the present disclosure may be [2] "the method for manufacturing an organic semiconductor element according to [1] further including a ninth process of forming a second terminal to be electrically connected to the second electrode on the main surface at least after the first process and before the sixth process, in which the sixth process is performed at least after the second process and the ninth process, and, in the sixth process, the predetermined region on the main surface includes a region on the first terminal and a region on the second terminal". According to the method for manufacturing an organic semiconductor element according to [2], it is possible to expose the first terminal and the second terminal while the organic semiconductor layer is covered with the barrier layer.

The method for manufacturing an organic semiconductor element according to one aspect of the present disclosure may be [3] "the method for manufacturing an organic semiconductor element according to [1] or [2], in which the fourth process and the sixth process are simultaneously performed". According to the method for manufacturing an organic semiconductor element according to [3], since the formation of the organic semiconductor layer and the formation of the sacrificial layer are simultaneously performed, the organic semiconductor element can be efficiently manufactured.

The method for manufacturing an organic semiconductor element according to one aspect of the present disclosure may be [4] "the method for manufacturing an organic semiconductor element according to [3], in which, in the fourth process and the sixth process, the organic semiconductor layer and the sacrificial layer are formed by a printing method under an identical condition". According to the method for manufacturing an organic semiconductor element according to [4], the organic semiconductor element can be more efficiently manufactured.

The method for manufacturing an organic semiconductor element according to one aspect of the present disclosure may be [5] "the method for manufacturing an organic semiconductor element according to [1] or [2], in which the fourth process and the sixth process are separately performed". According to the method for manufacturing an organic semiconductor element according to [5], the organic semiconductor layer and the sacrificial layer can be formed in a mode suitable for each.

The method for manufacturing an organic semiconductor element according to one aspect of the present disclosure may be [6] "the method for manufacturing an organic semiconductor element according to [5], in which, in the fourth process, the organic semiconductor layer is formed by a printing method under a first condition, and, in the sixth process, the sacrificial layer is formed by a printing method under a second condition different from the first condition". According to the method for manufacturing an organic semiconductor element according to [6], the organic semiconductor layer and the sacrificial layer can be formed in a mode suitable for each.

The method for manufacturing an organic semiconductor element according to one aspect of the present disclosure may be [7] "the method for manufacturing an organic semiconductor element according to any one of [1] to [6] further including a tenth process of forming a first functional layer on the first electrode after the third process and before the fourth process, and an eleventh process of forming a second functional layer on the organic semiconductor layer after the fourth process and before the fifth process, in which, in the fourth process, the organic semiconductor layer is formed on the first functional layer, and in the fifth process, the second electrode is formed on the second functional layer". According to [7], a function as the organic semiconductor element can be effectively exhibited.

The method for manufacturing an organic semiconductor element according to one aspect of the present disclosure may be [8] "the method for manufacturing an organic semiconductor element according to any one of [1] to [7], in which in the eighth process, the sacrificial layer and the portion of the barrier layer are removed by a solvent". According to the method for manufacturing an organic semiconductor element according to [8], the sacrificial layer and the portion of the barrier layer that covers the sacrificial layer can be efficiently removed.

The method for manufacturing an organic semiconductor element according to one aspect of the present disclosure may be [9] "the method for manufacturing an organic semiconductor element according to any one of [1] to [8], in which, in the seventh process, the barrier layer is formed by alternately laminating a plurality of first layers made of a first material and a plurality of second layers made of a second material different from the first material one by one". According to the method for manufacturing an organic semiconductor element according to [9], the organic semiconductor layer can be reliably sealed by the barrier layer.

The method for manufacturing an organic semiconductor element according to one aspect of the present disclosure may be [10] "the method for manufacturing an organic semiconductor element according to any one of [1] to [9], in which a thickness of the sacrificial layer is more than a thickness of the organic semiconductor layer after the second process, the fifth process, and the sixth process and before the seventh process". According to the method for manufacturing an organic semiconductor element according to [10], the sacrificial layer and the portion of the barrier layer that covers the sacrificial layer can be easily and reliably removed.

The method for manufacturing an organic semiconductor element according to one aspect of the present disclosure may be [11] "the method for manufacturing an organic semiconductor element according to any one of [1] to [10], in which, in the sixth process, the sacrificial layer is formed such that a ratio of a length of the sacrificial layer to a thickness of the sacrificial layer is 100 or more and 10,000 or less". According to the method for manufacturing an organic semiconductor element according to [11], the sacrificial layer and the portion of the barrier layer that covers the sacrificial layer can be easily and reliably removed.

The method for manufacturing an organic semiconductor element according to one aspect of the present disclosure may be [12] "the method for manufacturing an organic semiconductor element according to any one of [1] to [11], in which a thickness of the sacrificial layer is 10 times or more a thickness of the barrier layer after the seventh process". According to the method for manufacturing an organic semiconductor element according to [12], the sacrificial layer and the portion of the barrier layer that covers the sacrificial layer can be easily and reliably removed.

The method for manufacturing an organic semiconductor element according to one aspect of the present disclosure may be [13] "the method for manufacturing an organic semiconductor element according to any one of [1] to [12], in which a thickness of the sacrificial layer is equal to or more than a thickness of the first electrode after the third process and the sixth process". According to the method for manufacturing an organic semiconductor element according to [13], the sacrificial layer and the portion of the barrier layer that covers the sacrificial layer can be easily and reliably removed.

The method for manufacturing an organic semiconductor element according to one aspect of the present disclosure may be [14] "the method for manufacturing an organic semiconductor element according to any one of [1] to [13], in which a thickness of the sacrificial layer is equal to or more than a thickness of the second electrode after the fifth process and the sixth process". According to the method for manufacturing an organic semiconductor element according to [14], the sacrificial layer and the portion of the barrier layer that covers the sacrificial layer can be easily and reliably removed.

The method for manufacturing an organic semiconductor element according to one aspect of the present disclosure may be [15] "the method for manufacturing an organic semiconductor element according to any one of [1] to [14], in which, in the seventh process, the barrier layer is formed such that a thickness of the barrier layer is $\frac{1}{10}$ or less of a sum of a thickness of the first electrode, a thickness of the organic semiconductor layer, and a thickness of the second electrode". According to the method for manufacturing an organic semiconductor element according to [15], the portion of the barrier layer that covers the sacrificial layer can be easily and reliably removed.

According to the present disclosure, it is possible to provide the method for manufacturing an organic semiconductor element capable of exposing the predetermined region on the substrate while the organic semiconductor layer is covered with the barrier layer.

What is claimed is:

1. A method for manufacturing an organic semiconductor element, comprising:
   a first process of preparing a substrate having a main surface;
   a second process of forming a first terminal on the main surface at least after the first process;
   a third process of forming a first electrode to be electrically connected to the first terminal on the main surface at least after the first process;

a fourth process of forming an organic semiconductor layer on the first electrode at least after the third process;

a fifth process of forming a second electrode on the organic semiconductor layer at least after the fourth process;

a sixth process of forming a sacrificial layer made of an organic material identical to the organic semiconductor layer in a predetermined region on the main surface at least after the first process;

a seventh process of forming a barrier layer on the main surface by an ALD method to cover the first terminal, the first electrode, the second electrode, the organic semiconductor layer, and the sacrificial layer after the second process, the fifth process, and the sixth process; and an eighth process of removing the sacrificial layer and a portion of the barrier layer after the seventh process, the portion covering the sacrificial layer, wherein the organic semiconductor layer and the sacrificial layer are apart from each other after the second process, the fifth process, and the sixth process and before the seventh process.

2. The method for manufacturing an organic semiconductor element according to claim 1, further comprising a ninth process of forming a second terminal to be electrically connected to the second electrode on the main surface at least after the first process and before the sixth process, wherein the sixth process is performed at least after the second process and the ninth process, and in the sixth process, the predetermined region on the main surface includes a region on the first terminal and a region on the second terminal.

3. The method for manufacturing an organic semiconductor element according to claim 1, wherein the fourth process and the sixth process are simultaneously performed.

4. The method for manufacturing an organic semiconductor element according to claim 3, wherein, in the fourth process and the sixth process, the organic semiconductor layer and the sacrificial layer are formed by a printing method under an identical condition.

5. The method for manufacturing an organic semiconductor element according to claim 1, wherein the fourth process and the sixth process are separately performed.

6. The method for manufacturing an organic semiconductor element according to claim 5, wherein, in the fourth process, the organic semiconductor layer is formed by a printing method under a first condition, and in the sixth process, the sacrificial layer is formed by a printing method under a second condition different from the first condition.

7. The method for manufacturing an organic semiconductor element according to claim 1, further comprising:

a tenth process of forming a first functional layer on the first electrode after the third process and before the fourth process; and an eleventh process of forming a second functional layer on the organic semiconductor layer after the fourth process and before the fifth process, wherein, in the fourth process, the organic semiconductor layer is formed on the first functional layer, and in the fifth process, the second electrode is formed on the second functional layer.

8. The method for manufacturing an organic semiconductor element according to claim 1, wherein, in the eighth process, the sacrificial layer and the portion of the barrier layer are removed by a solvent.

9. The method for manufacturing an organic semiconductor element according to claim 1, wherein, in the seventh process, the barrier layer is formed by alternately laminating a plurality of first layers made of a first material and a plurality of second layers made of a second material different from the first material one by one.

10. The method for manufacturing an organic semiconductor element according to claim 1, wherein a thickness of the sacrificial layer is more than a thickness of the organic semiconductor layer after the second process, the fifth process, and the sixth process and before the seventh process.

11. The method for manufacturing an organic semiconductor element according to claim 1, wherein, in the sixth process, the sacrificial layer is formed such that a ratio of a length of the sacrificial layer to a thickness of the sacrificial layer is 100 or more and 10,000 or less.

12. The method for manufacturing an organic semiconductor element according to claim 1, wherein a thickness of the sacrificial layer is 10 times or more a thickness of the barrier layer after the seventh process.

13. The method for manufacturing an organic semiconductor element according to claim 1, wherein a thickness of the sacrificial layer is equal to or more than a thickness of the first electrode after the third process and the sixth process.

14. The method for manufacturing an organic semiconductor element according to claim 1, wherein a thickness of the sacrificial layer is equal to or more than a thickness of the second electrode after the fifth process and the sixth process.

15. The method for manufacturing an organic semiconductor element according to claim 1, wherein, in the seventh process, the barrier layer is formed such that a thickness of the barrier layer is $1/10$ or less of a sum of a thickness of the first electrode, a thickness of the organic semiconductor layer, and a thickness of the second electrode.

* * * * *